US012813227B2

(12) United States Patent
Variyam

(10) Patent No.: US 12,813,227 B2
(45) Date of Patent: Nov. 24, 2026

(54) SYSTEMS AND METHODS TO HANDLE SEMICONDUCTOR DEVICES FOR TESTING

(71) Applicant: Anora, LLC, Richardson, TX (US)

(72) Inventor: Pramodchandran N. Variyam, Plano, TX (US)

(73) Assignee: Anora, LLC, Allen, TX (US)

( * ) Notice: Subject to any disclaimer, the term of this patent is extended or adjusted under 35 U.S.C. 154(b) by 479 days.

(21) Appl. No.: 18/442,216

(22) Filed: Feb. 15, 2024

(65) Prior Publication Data

US 2025/0266283 A1 Aug. 21, 2025

(51) Int. Cl.

*H10P 74/20* (2026.01)
*H10P 72/78* (2026.01)
*H10P 74/00* (2026.01)
*H10P 72/70* (2026.01)

(52) U.S. Cl.

CPC ............ *H10P 72/78* (2026.01); *H10P 74/203* (2026.01); *H10P 74/238* (2026.01); *H10P 72/7408* (2026.01)

(58) Field of Classification Search

CPC .... H10P 72/78; H10P 72/7408; H10P 74/203; H10P 74/238

See application file for complete search history.

(56) References Cited

U.S. PATENT DOCUMENTS

| | | | | |
|---|---|---|---|---|
| 5,865,319 | A * | 2/1999 | Okuda ............... | G01R 31/2851 209/571 |
| 2011/0211937 | A1 | 9/2011 | Weinberger | |
| 2016/0116503 | A1* | 4/2016 | Kiyokawa .......... | G01R 1/07342 324/750.25 |
| 2017/0285102 | A1 | 10/2017 | Ding et al. | |
| 2020/0070350 | A1 | 3/2020 | Thobe et al. | |
| 2022/0128599 | A1 | 4/2022 | Campbell et al. | |

* cited by examiner

*Primary Examiner* — Gary Collins
(74) *Attorney, Agent, or Firm* — Aambell PC

(57) ABSTRACT

A handler in a system for handling semiconductor devices for testing, the handler comprising a first plate, a second plate offset from the first plate, a first subsystem slidably coupled to the first plate, and a second subsystem slidably coupled to the second plate. The first subsystem comprises a pick-and-place (PNP) carriage to slide along the Y-axis. The PNP carriage comprises a PNP head to slide along the X-axis. The PNP head comprises a PNP nozzle head to slide along the Z-axis. The second subsystem comprises a thermo-mechanical (TM) carriage to slide along the X-axis and a TM head slidably coupled to the carriage to slide along the Z-axis. The PNP nozzle head includes a PNP nozzle to pick a semiconductor device from a tray and place it to a printed circuit board for testing. The TM head provides pressure on the semiconductor device and facilitates testing at different temperatures.

20 Claims, 20 Drawing Sheets

SYSTEMS AND METHODS TO HANDLE SEMICONDUCTOR DEVICES FOR TESTING

BACKGROUND

Semiconductor devices are typically tested to ensure they meet quality standards and performance specifications before they are released for production (i.e., large scale manufacture) or commercial use. Before production, semiconductor devices may be subject to engineering testing, for example, to validate their functionalities, to ensure design standards are met across various temperatures, and to assess their reliability in the field, among other reasons. Such engineering testing may be performed in testing laboratories. Production testing of semiconductor devices, on the other hand, typically takes place in controlled environments such as semiconductor fabrication or assembly facilities. These environments are equipped with specialized testing equipment and tools, such as automated test equipment (ATE), probe stations, test sockets, and test fixtures that enable efficient and accurate testing of semiconductor devices in high-volume production. In such engineering and production testing, automated robotic handlers play a crucial role in enabling rapid and precise testing of semiconductor devices.

BRIEF DESCRIPTION OF DRAWINGS

Embodiments will be readily understood by the following detailed description in conjunction with the accompanying drawings. To facilitate this description, like reference numerals designate like elements. Embodiments are illustrated by way of example, and not by way of limitation, in the figures of the accompanying drawings.

DETAILED DESCRIPTION

Overview

Figure 1A:
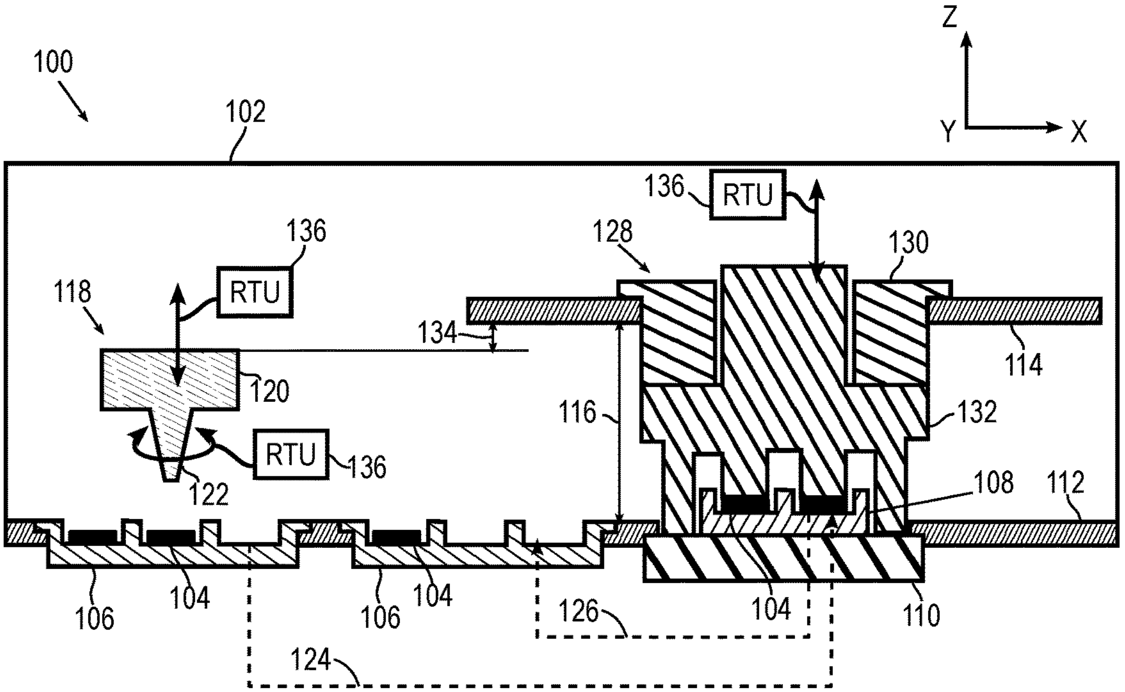
FIGS. 1A-1D are simplified block diagrams illustrating an example system for handling semiconductor devices during testing.

For purposes of illustrating the embodiments described herein, it is important to understand certain terminology and operations of technology networks. The following foundational information may be viewed as a basis from which the present disclosure may be properly explained. Such information is offered for purposes of explanation only and, accordingly, should not be construed in any way to limit the broad scope of the present disclosure and its potential applications.

In the following detailed description, various aspects of the illustrative implementations may be described using terms commonly employed by those skilled in the art to convey the substance of their work to others skilled in the art.

The term “semiconductor device” means any electronic component that is commonly manufactured using semiconductor materials but can also include components that do not contain any semiconductor materials, for example, integrated circuits (ICs), diodes, transistors, light emitting diodes (LEDs), resistors, capacitors, inductors, transformers, and the like that may be packaged together into one cohesive structure that can be handled as a unit. For example, the semiconductor device may include one or more semiconductor dies (e.g., chips) assembled on a package substrate and encapsulated by a mold compound. The semiconductor device may be any suitable package type, such as ball grid array, chip-scale package, quad flat no-leads package (QFN), etc.

The term "tester" refers to any instrument that can test a semiconductor device electrically, and includes, as examples and not as limitations, ATE, functional testers, boundary scan testers, parametric analyzers, probers, thermal testers, curve tracers, etc. The tester may be used to test the semiconductor device for functionality, reliability, quality, and other purposes.

The term "controller" is an electronic component that may be used to mange and regulate the operation of a system; in general, controllers receive electrical signals, process them using suitable algorithms and embedded logic, and generate output electrical signals that are used to control various aspects of a system's behavior, such as motions of actuators including motors, heaters, etc. The controller may be a standalone device, for example, a programmable logic controller (PLC), a dedicated computer, a laptop, electronic pad, etc. The controller may also be provisioned in another device, for example a general-purpose computer, laptop, electronic pad, etc.

The term "connected" means a direct connection (which may be one or more of a communication, mechanical, and/or electrical connection) between the things that are connected, without any intermediary devices, while the term "coupled" means either a direct connection between the things that are connected, or an indirect connection through one or more passive or active intermediary devices.

The term "computing device" means a server, a desktop computer, a laptop computer, a smartphone, or any device with a microprocessor, such as a central processing unit (CPU), general processing unit (GPU), or other such electronic component capable of executing processes of a software algorithm (such as a software program, code, application, macro, etc.).

The description uses the phrases "in an embodiment" or "in embodiments," which may each refer to one or more of the same or different embodiments.

Although certain elements may be referred to in the singular herein, such elements may include multiple sub-elements. For example, "a controller" may include one or more controllers.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale. In the drawings, same reference numerals refer to the same or analogous elements shown so that, unless stated otherwise, explanations of an element with a given reference numeral provided in context of one of the drawings are applicable to other drawings where element with the same reference numerals may be illustrated. Further, the singular and plural forms of the labels may be used with reference numerals to denote a single one and multiple ones respectively of the same or analogous type, species, or class of element.

Note that in the figures, various components are shown as aligned, adjacent, or physically proximate merely for ease of illustration; in actuality, some or all of them may be spatially distant from each other. In addition, there may be other components, such as wires, cables, hoses, fasteners, cable carriers, energy chains, routers, switches, antennas, communication devices, etc. and features such as cable ties, holes, recesses, openings, rails, etc. in the systems and networks disclosed that are not shown in the figures to prevent cluttering. Systems and networks described herein may include, in addition to the elements described, other components and services, including communication interfaces, microprocessors, microcontrollers, network management and access software, connectivity services, routing services, firewall services, content delivery networks, virtual private networks, etc. Further, the figures are intended to show relative arrangements of the components within their systems, and, in general, such systems may include other components that are not illustrated (e.g., various mechanical components and electronic components related to handling functionality, electrical connectivity, etc.).

In the drawings, a particular number and arrangement of structures and components are presented for illustrative purposes and any desired number or arrangement of such structures and components may be present in various embodiments. Further, unless otherwise specified, the structures shown in the figures may take any suitable form or shape according to various design considerations, manufacturing processes, and other criteria beyond the scope of the present disclosure.

For convenience, if a collection of drawings designated with different letters are present (e.g., FIGS. 1A-1D), such a collection may be referred to herein without the letters (e.g., as "FIG. 1"). Similarly, if a collection of reference numerals designated with different letters are present (e.g., 206A, 206B), such a collection may be referred to herein without the letters (e.g., as "206") and individual ones in the collection may be referred to herein with the letters. Further, labels in upper case in the figures (e.g., 206A) may be written using lower case in the description herein (e.g., 206A) and should be construed as referring to the same elements.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Handlers are specialized equipment used in semiconductor testing to automate the process of handling semiconductor devices during testing and sorting operations. Semiconductor devices are typically manufactured as packaged units placed in standardized trays, such as JEDEC trays. Handlers automatically pick up the semiconductor device from its tray, places it in a test socket for testing, and then returns them to the same or another tray based on the testing results. Devices that pass testing criteria may be sorted into different bins or trays based on their specifications, while defective devices may be separated for further analysis or disposition. Handlers ensure precise positioning of the semiconductor devices during testing to ensure accurate electrical contact with test sockets. This precision is essential for obtaining reliable test results and diagnosing any defects or performance issues in the devices being tested. Some handlers also feature temperature control capabilities to ensure that devices are tested under specified temperature conditions. Semiconductor handlers significantly increase the throughput and efficiency of semiconductor testing operations. By automating the handling process, handlers can process a large number of devices in a relatively short amount of time, improving overall production rates and reducing testing cycle times.

Various handlers are available in the market for performing such automated handling operations. They differ from each other in their mechanical and electrical efficiency, cost, ease of use and such other criteria. They also use different mechanical and electrical components and features to enable their operations, such choices being based on the respective handlers' functionality, performance, etc. Typically, they are all limited in their ability to visually identify different types of semiconductor devices in their trays. For example, some handlers can identify semiconductor devices that are larger than a particular size (e.g., 5 mm×5 mm), but need specialized additional visual components to identify smaller semiconductor devices. The reason for such differentiation arises from the optical components used to identify the semiconductor devices; typical handlers use lasers to identify larger semiconductor devices, with additional cameras having finer optical resolution for the smaller sized devices. Such a modular approach, while advantageous in certain scenarios (e.g., where the same sized semiconductor devices are tested routinely), may not be suitable in a factory or environment where semiconductor devices of quite different dimensions are tested serially. In the latter case, each time a different sized device is to be tested, the equipment needs to be recalibrated, adjusted, or otherwise made suitable for enabling or disabling the additional high-resolution camera, leading to loss of production time.

In addition, many of the handlers require a "precisor," which is a calibrated mechanism for precisely positioning the semiconductor device. In machines having the precisor, the pick-and-place nozzle initially picks up the semiconductor device from its tray and places it in the precisor. The precisor is structured to enable the semiconductor device placed in any orientation to realign to a predetermined, calibrated orientation. Thereafter, the nozzle picks up the semiconductor device and places it in the test socket with the correct alignment. Without the precisor, the semiconductor device may be misaligned in the test socket, leading to spurious test failures or device damage during testing. However, the precisor is an added part, which needs to be precisely machined separately for each device to be tested in many cases, leading to higher costs.

Further, some handlers that perform temperature-controlled testing (e.g., at different temperatures) use a thermal head coupled together with a pick-and-place nozzle, probably for ease of controlling both using a single set of sensors. The thermal head includes thermal hoses for the hot and cold fluids used in convective heat transfer, and/or wires used in conductive heat transfer. These hoses and/or wires are heavy and are usually managed by an energy chain (e-chain) that moves with the pick-and-place nozzle. Continuous movement of the hoses and/or wires within the e-chains lead to abrasion of the hoses and/or wires over time, leading to performance/reliability issues. Some other handlers overcome this problem by decoupling the thermal functionality from the pick-and-place functionality; in such systems, the thermal head and the pick-and-place head slide on the same gantry, for example, to ensure common alignment. However, placing them on the same gantry increases the load on the gantry while unnecessarily moving the heavy thermal head while the pick-and-place head is performing its functions, and vice versa.

Many handlers that perform temperature-controlled testing also enclose the entire test setup within a chamber during testing at hot and/or cold temperatures. Heating and cooling these large chambers can lead to inefficiencies in heat transfer, not to mention unnecessary waste of energy to bring the entire chamber to thermal equilibrium, particularly when only the heating or cooling of the much smaller semiconductor device is relevant to the testing.

Accordingly, embodiments of the handler disclosed herein separate the pick-and-place functionality and thermal functionality into two separate subsystems that are independently moveable relative to each other. Further, in some variations, the subsystem having thermal functionality can also facilitate exerting a predetermined pressure on the semiconductor device during testing. The predetermined pressure is calibrated in situ to be sufficient to enable electrical connectivity between the semiconductor device and the printed circuit board. Further, unlike other commonly available handlers, the system disclosed herein according to some embodiments use a casing to envelope the semiconductor device during testing so that heat transfer is contained within a smaller space within the handler, allowing for more efficient heat transfer.

Additionally, semiconductor devices within any suitable size range can be handled using a corresponding vision system having a field of vision. In other words, if the device can be located within the field of vision of the handler's vision system, the device can be handled by the handler without additional fixtures or adjustments. In addition, different device sizes may be easily accommodated simply by changing the cameras in the vision system without adding or modifying any other component of the handler. Such a single vision sensor system controlled by appropriate embedded algorithms permit a broad range of semiconductor devices to be handled precisely and seamlessly without any additional components such as the precisor or adjustments such as an added vision system for smaller devices. The embedded control algorithms enable the vision system comprising an optical camera to accurately identify a semiconductor device in its tray, determine its alignment, and inform a pick-and-place head to actuate a nozzle for appropriately picking up the semiconductor device from its tray, orienting it to the correct alignment and placing it accurately in the test socket. Movements of other components are accurately controlled by proximity sensors and motor sensors without using complex vision systems, enabling cost-effective, efficient and precise handling of semiconductor devices for testing.

Example Embodiments

FIGS. 1A-1D are simplified block diagrams illustrating a system 100 for handling semiconductor devices during testing according to an example embodiment. As illustrated in FIG. 1A, system 100 includes a handler 102 for automatically picking a semiconductor device 104 from a tray 106 and placing it in a socket 108 on a printed circuit board 110. Tray 106 and printed circuit board 110 may be positioned in a handler bottom plate 112. In some embodiments, printed circuit board 110 may be fastened to handler bottom plate 112. In other embodiments, printed circuit board 110 may be part of a tester (not shown) that may be placed underneath handler bottom plate 112. Printed circuit board 110 has two opposing sides: one facing the components of handler 102 and on which, socket 108 is located, and the other facing the tester.

Handler bottom plate 112 is coupled to a handler top plate 114 that may be positioned away from handler bottom plate 112 by a Z-offset 116. With reference to a three-dimensional space defined by mutually orthogonal axes X-axis, Y-axis and Z-axis, handler bottom plate 112 is fixed in the X-Y plane, and handler top plate 114 is fixed parallel to and offset from handler bottom plate 112 along the Z-axis by Z-offset 116. In terms of semantics, widths of components in system 100 may be considered as being along the Y-axis, the lengths may be along the X-axis, and the heights may be along the Z-axis.

A pick-and-place (PNP) subsystem 118 is slidably coupled to handler bottom plate 112 such that PNP subsystem 118 can slide along the Y-axis. PNP subsystem 118 comprises a PNP head 120 which can slide along the X-axis. PNP head 120 includes a PNP nozzle head 122 which can slide along the Z-axis and some components in PNP nozzle head 122 can rotate around the Z-axis. PNP subsystem 118 has at least two functionalities: (1) picking up semiconductor device 104 from tray 106 and placing it in socket 108 as shown by PNP path 124, and (2) picking up semiconductor device 104 from socket 108 and placing it in tray 106 as shown by PNP path 126. In various embodiments, PNP head 120 is configured to pick up semiconductor device 104 and align it suitably for placing in socket 108 or tray 106. In some embodiments (as shown), tray 106 to which the tested semiconductor device 104 is returned may be different from tray 106 from which untested semiconductor device 104 was picked up. In other embodiments (not shown), tray 106 to which the tested semiconductor device 104 is returned may be the same as tray 106 from which untested semiconductor device 104 was picked up.

A thermo-mechanical (TM) subsystem 128 is slidably coupled to handler top plate 114 such that TM subsystem 128 can slide along the X-axis. TM subsystem 128 comprises a TM carriage 130 movable along the X-axis and fixed relative to the Z-axis, and a TM head 132 slidably coupled to TM carriage 130 such that TM head 132 can slide along the Z-axis. TM subsystem 128 has at least two functionalities: (1) facilitate exertion of a predetermined pressure on semiconductor device 104 in socket 108, and (2) optionally facilitate heating or cooling of semiconductor device 104 during testing. In scenarios where semiconductor device 104 is to be tested at room temperature, the second functionality may not be operational. In various embodiments, TM head 132 is configured to facilitate exertion of the predetermined pressure on semiconductor device 104 in socket 108. The top of PNP subsystem 118 clears the bottom of handler top plate 114 by a Z-clearance 134 such that PNP subsystem 118 can move unimpeded in the X-Y plane without being obstructed by TM subsystem 128. One or more remote terminal units (RTUs) 136 may be used to control each of the movements, i.e., translation (e.g., sliding) along the X-axis, the Y-axis and the Z-axis, and rotation around the Z-axis of the various components described herein.

Figure 1B:
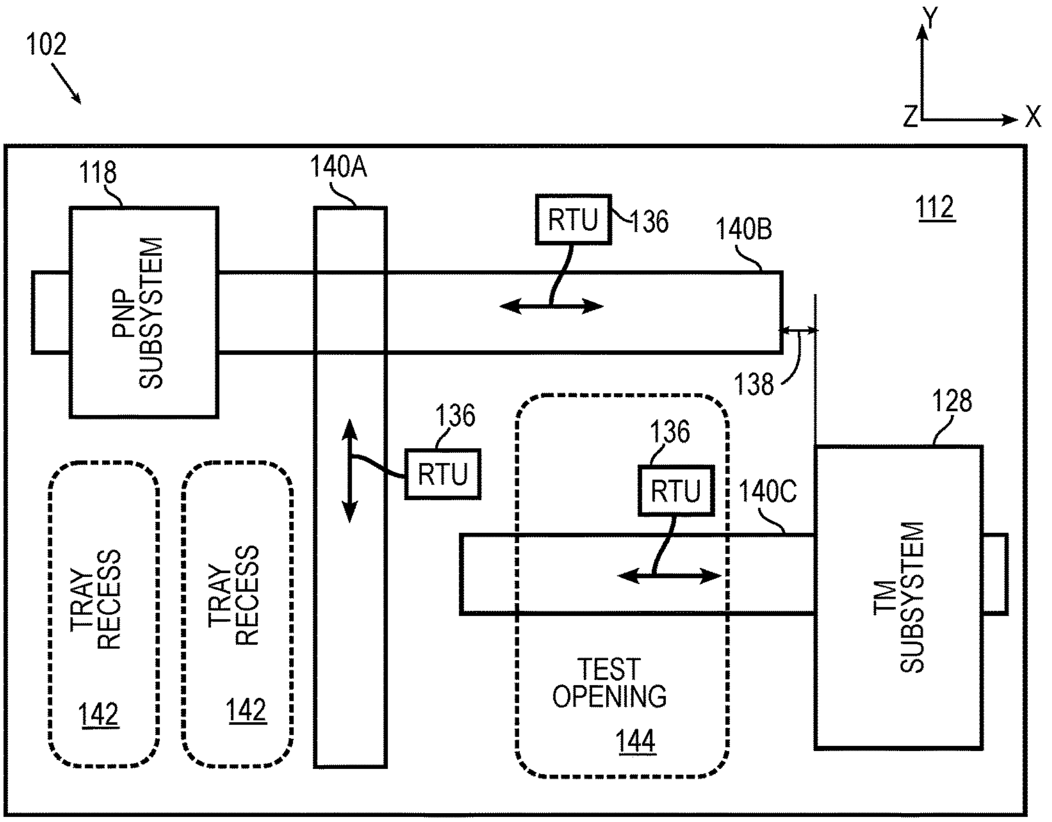

A top view of handler 102 is schematically shown in FIG. 1B. PNP subsystem 118 and TM subsystem 128 are shown in their respective home (e.g., resting, retracted) positions. The maximum travel of PNP head 120 along the X-axis is offset from the home position of TM subsystem 128 by an X-clearance 138. Movements of various components in handler 102 may be facilitated by one or more of actuator 140. For example, sliding of PNP subsystem 118 along the Y-axis may be facilitated by actuator 140A. Sliding of PNP head 120 along the X-axis may be facilitated by actuator 140B. Sliding of TM subsystem 128 along the X-axis may be facilitated by actuator 140C. Not shown in the figure are actuators 140D, 140E, and 140F that facilitate sliding of TM head 132 along the Z-axis, sliding of PNP nozzle head 122 along the Z-axis and rotation of PNP nozzle head 122 around the Z-axis, respectively.

Actuator 140 may be of any suitable kind for the functionality it provides. In a particular embodiment, actuator 140 for sliding may comprise a servo motor coupled with a rotating lead screw. In another embodiments, actuator 140 may comprise a stepper motor coupled with a rotating lead screw. In yet another embodiment, actuator 140 may comprise a theta-motor to facilitate rotation around the Z-axis. Various other choices of actuator 140 are included within the broad scope of the embodiments herein. In some embodiments, actuator 140 may comprise additional machine elements, such as gears and belts to enable separation of the motor and the lead screw. Each actuator 140 may be controlled by a separate one of RTU 136 in some embodiments. In other embodiments, more than one actuator 140 may be controlled commonly by a single one of RTU 136. Various such arrangements are included in the broad scope of the various embodiments discussed herein.

Handler bottom plate 112 may include one or more tray recesses 142 for tray 106 configured for placing semiconductor devices 104 and a test opening 144 to receive printed circuit board 110. In some embodiments, tray 106 comprises a matrix tray (e.g., waffle tray) having dimensions approximately according to JEDEC standards. Tray 106 may accommodate a plurality of semiconductor devices 104 suitably. In some embodiments, tray recess 142 may have a bottom to support the bottom of tray 106. In other embodiments, tray recess 142 may be an opening with tray 106 hanging from a lip around tray recess 142. Various other ways of placing tray 106 in tray recess 142 are included within the broad scope of the embodiments herein. Test opening 144 may be sized suitably to expose printed circuit board 110, particularly, socket 108 to the various components of handler 102.

Separate sets of rails (not shown) may enable sliding of the various components suitably. For example, one set of rails (e.g., tracks) may enable PNP subsystem 118 to slide along the Y-axis when powered by actuator 140A; another set of rails may enable PNP head 120 to slide along the X-axis when powered by actuator 140B; yet another set of rails may enable TM subsystem 128 to slide along the X-axis when powered by actuator 140C; and so on. Note that rails are merely one example of a mechanical component to facilitate sliding; other components such as wheels, tracks, grooves, etc. may alternatively be used without departing from the scope of the embodiments.

TM subsystem 128 may be positioned to translate approximately around the middle of test opening 144 where socket 108 will be located during operation, so that sliding from its home position along the X-axis, TM subsystem 128 may reach socket 108 easily without additional movements, for example, along Y-axis. In some other embodiments, TM subsystem 128 may be configured with manual adjustment capabilities along the Y-axis (e.g., using screws, rods, etc.) to allow TM subsystem 128 to be placed accurately over socket 108 during operation.

Figure 1C:
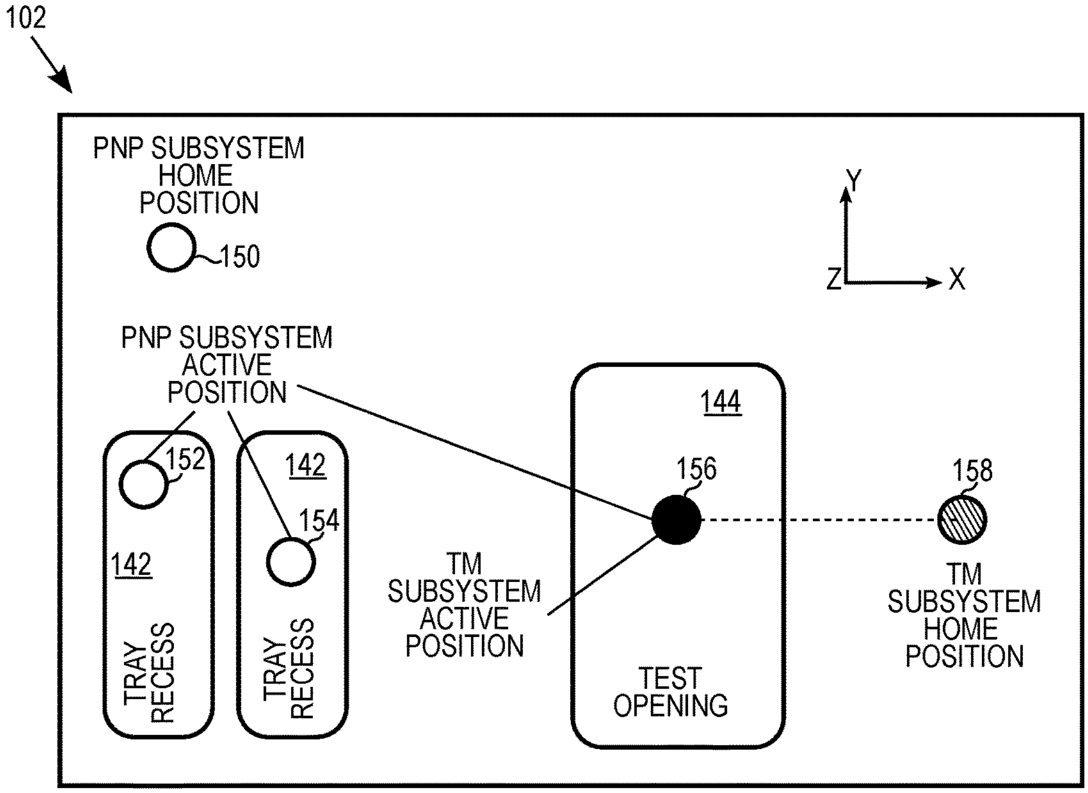

FIG. 1C shows details of the various positions of the components of handler 102. PNP home position 150 represents the home (e.g., base, inactive, retracted, etc.) position of PNP subsystem 118. PNP subsystem 118 moves between PNP home position 150 and a plurality of active positions 152-156. Active position 152 represents the location to pick up semiconductor device 104 from tray 106 in tray recess 142. Active position 154 represents the location to return semiconductor device 104 to tray 106 in tray recess 142. Note that active positions 152 and 154 may be in the same tray 106 in tray recess 142 in some embodiments. In other embodiments, active positions 152 and 154 may be in different trays 106. Active position 156 represents the location to place semiconductor device 104 in socket 108 in test opening 144. In some embodiments, socket 108 may have a plurality of sites, each site configured for a single semiconductor device 104. In such embodiments, active position 156 represents the specific site in socket 108 where semiconductor device 104 is to be placed. Active position 156 also represents the active position of TM subsystem 128. TM home position 158 represents the home (e.g., base, inactive, retracted, etc.) position of TM subsystem 128.

Note that while active positions 152-156 may be located in the X-Y plane relative to PNP home position 150 (i.e., offset in both X-axis and Y-axis relative to PNP home position 150), active position 156 is only linearly offset from TM home position 158 along the X-axis in some embodiments. This follows from the independent motions of PNP subsystem 118 and TM subsystem 128. While PNP subsystem 118 has separate and independent actuators 140A and 140B to allow movements independently along the X-axis and the Y-axis, TM subsystem 128 has only actuator 140C to allow sliding along the X-axis in the X-Y plane. In some embodiments, TM subsystem 128 may be configured with manual adjustments to enable moving TM subsystem 128 slightly along the Y-axis, for example, to ensure accurate placement over socket 108. Note that other actuators 140 (not shown) allow sliding of components in PNP subsystem 118 and TM subsystem 128 along the Z-axis.

Figure 1D:
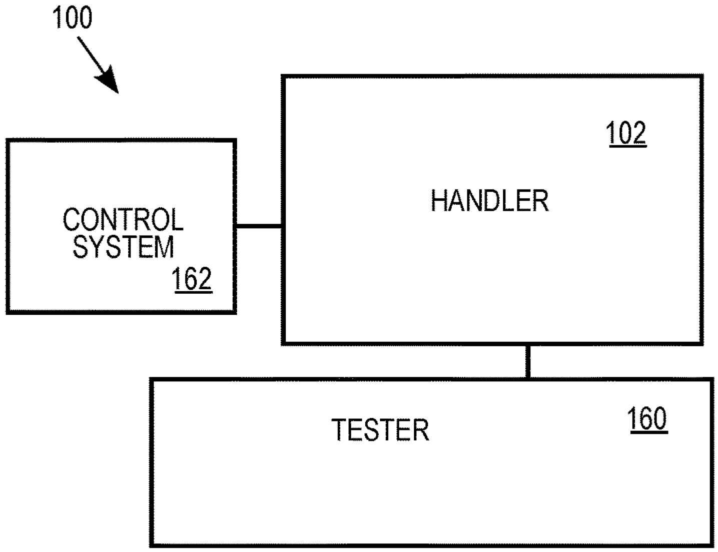

FIG. 1D illustrates a schematic block diagram showing the relationship between handler 102 and other components of system 100 during operation. A tester 160 and a control system 162 may communicate with handler 102 during various operations. Control system 162 may automate some operations of handler 102 suitably to enable it to operate without human intervention. For example, movements of PNP subsystem 118 and TM subsystem 128 may be controlled by control system 162 without human intervention. Control system 162 may include a controller that controls the various ones of RTU 136 to enable picking up semiconductor device 104 from tray 106 and placing it in socket 108. In one example embodiment, these operations may comprise moving PNP subsystem 118 from PNP home position 150 to active position 152, identifying alignment of semiconductor device 104 in tray 106, adjusting PNP nozzle head 122 accordingly, picking up semiconductor device 104, moving PNP subsystem 118 to active position 156, and placing semiconductor device 104 in socket 108. Thereafter, control system 162 may enable retracting PNP subsystem 118 to PNP home position 150, or away from active position 156, and moving TM subsystem 128 to active position 156. Control system 162 may also control mechanical and thermal operations of TM subsystem 128, for example, to apply pressure on semiconductor device 104 and/or soak semiconductor device 104 at a predetermined temperature according to testing criteria.

Control system 162 may also coordinate between handler 102 and tester 160 suitably. For example, after thermal operations are complete, and semiconductor device 104 is ready for testing, handler 102 may communicate to tester 160 that semiconductor device 104 is ready, upon which, tester 160 may commence testing operations. When testing is complete, in some embodiments, tester 160 may communicate to handler 102 the sorting bin to which semiconductor device 104 is to be returned. In such embodiments, handler 102 may relay the communication to control system 162. In other embodiments, when testing is complete, tester 160 may communicate to control system 162 the sorting bin to which semiconductor device 104 is to be returned. Control system 162 determines active position 154 based on the sorting bin information from tester 160. Control system 162 may then facilitate moving TM subsystem 128 back to TM home position 158 (or away from active position 156) and facilitate moving PNP subsystem 118 from PNP home position 150 to pick up semiconductor device 104 from socket 108 and return it to tray 106 (i.e., active position 154).

In some embodiments, one or more of these features may be implemented in hardware, provided external to these elements, or consolidated in any appropriate manner to achieve the intended functionality. The various elements in system 100 may include communication software that can coordinate to achieve the operations as outlined herein. In still other embodiments, these elements may include any suitable algorithms, hardware, software, components, modules, interfaces, or objects that facilitate the operations thereof.

Figure 2A:
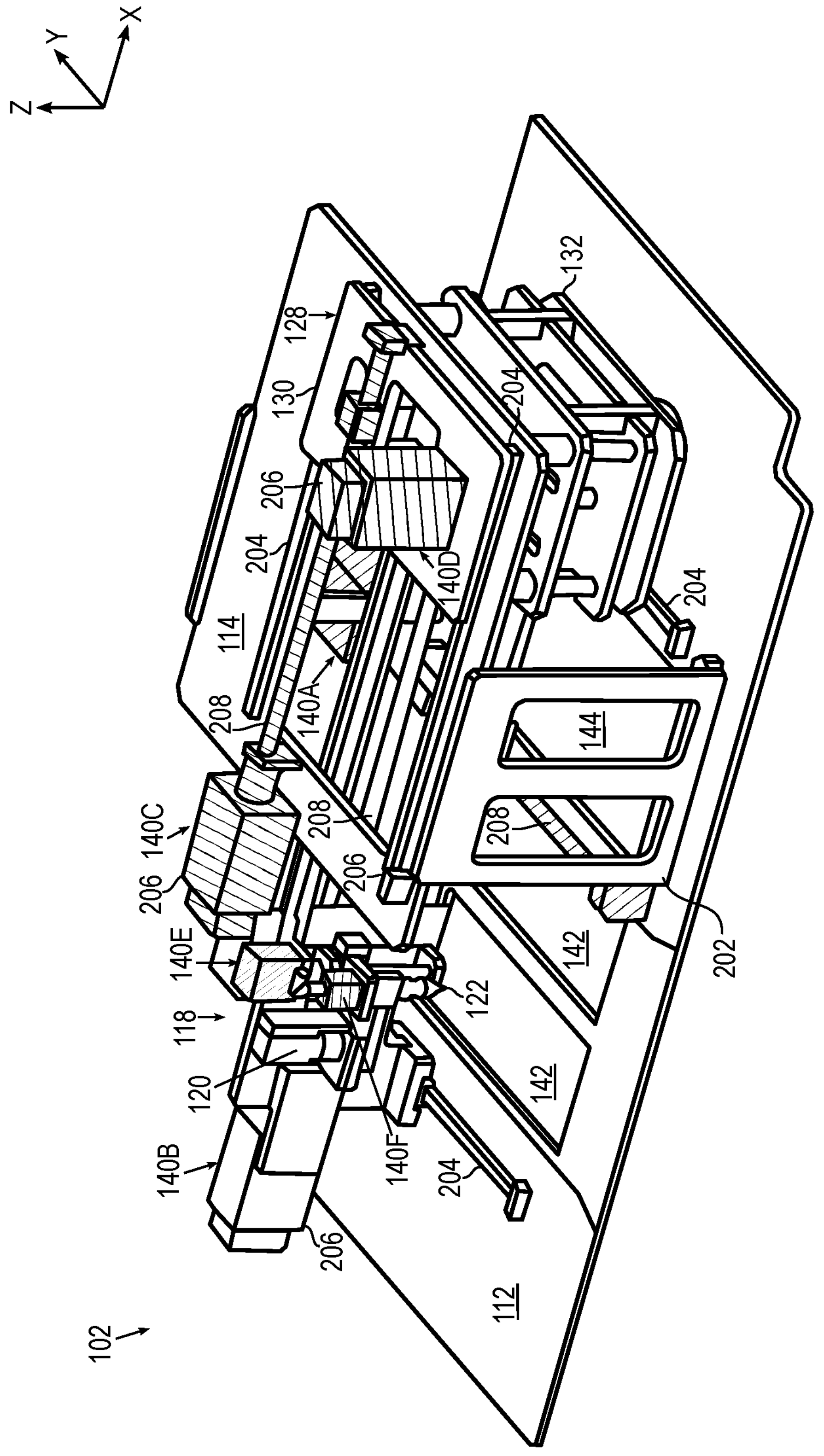
FIGS. 2A and 2B are a simplified perspective view and front view respectively of a portion of an example system for handling semiconductor devices during testing.

FIG. 2A is a simplified perspective view of a portion of system 100, specifically, handler 102, according to an embodiment of the present disclosure. Handler 102 comprises a pair of handler side plates 202 in a X-Z plane directly coupled to handler bottom plate 112 and handler top plate 114. Handler side plates 202 are sized appropriately such that handler top plate 114 is at Z-offset 116 from handler bottom plate 112. Handler side plates 202 may be mounted to handler bottom plate 112 and handler top plate 114 using any suitable fastening mechanism, such as screws, nuts and bolts, nails, rivets, welds, etc.

In some embodiments, PNP subsystem 118 and TM subsystem 128 may translate on rails 204 affixed appropriately to suitable ones of handler bottom plate 112 and handler top plate 114. For example, PNP subsystem 118 may translate along the Y-axis on rails 204 fixed to handler bottom plate 112. TM subsystem 128 may translate along the X-axis on rails 204 fixed to handler top plate 114. Sliding on rails 204 may be enabled by suitable sliders (not labeled in the figure to prevent crowding) fixed to the respective subsystems appropriately. Motion on rails 204 may be actuated by one or more actuator 140. Some of actuator 140 (e.g., 140A-140E), may comprise a motor 206 that enables rotation of a lead screw 208. The rotation is converted to linear translation by a corresponding nut (not labeled to prevent crowding) that can move back and forth on lead screw 208. Other ones of actuator 140 (e.g., 140F) may comprise a theta-motor that enables rotation around a shaft.

In some embodiments, TM carriage 130 slides on rails 204 affixed to handler top plate 114. TM carriage 130 extends partially between the top of handler top plate 114 and the top of handler bottom plate 112. TM head 132 is slidably coupled to TM carriage 130 for motion along the Z-axis. The Z-axis motion is facilitated by actuator 140D attached to TM carriage 130. In some embodiments, actuator 140D comprises a servo motor 206 coupled to a lead screw (not shown), and TM head 132 is fixed to the nut (not shown) that translates on the lead screw. Rotation of the lead screw enables TM head 132 to slide along the Z-axis suitably.

PNP head 120 is slidably coupled in PNP subsystem 118, enabled by actuator 140B to move along the X-axis, with PNP nozzle head 122 additionally configured to slide along the Z-axis. The Z-axis motion is facilitated by actuator 140E in PNP subsystem 118. In some embodiments, actuator 140E comprises a stepper motor coupled to a lead screw (not shown), and PNP nozzle head 122 is fixed to the nut that translates on the lead screw. Rotation of the lead screw enables PNP nozzle head 122 to slide along the Z-axis suitably. A servo motor may be used instead of a stepper motor without departing from the scope of the embodiments. Actuator 140F may enable a PNP nozzle in PNP nozzle head 122 to rotate around the Z-axis suitably.

During operation, actuators 140A and 140B enable PNP subsystem 118 to move from PNP home position 150 to active position 152. Actuators 140A and 140B facilitate adjustment of PNP head 120 over semiconductor device 104. Actuator 140E enables PNP nozzle head 122 to move down and contact semiconductor device 104. In some embodiments, PNP nozzle head 122 may be provisioned with a vacuum tube and activation of the vacuum may cause semiconductor device 104 to "stick" to PNP nozzle head 122. Actuator 140F adjusts the angle of PNP nozzle head 122 suitably so that semiconductor device 104 is aligned to be placed into socket 108 correctly. Actuator 140E lifts PNP nozzle head 122 upwards, for example, to clear other components during subsequent travel. Thereafter, actuators 140A and 140B enable PNP head 120 to move to active position 156 over socket 108. Actuator 140E drops PNP nozzle head 122 down sufficiently to place semiconductor device 104 inside socket 108. Thereafter, actuators 140A, 140B, and 140E may lift PNP nozzle head 122 up and retract PNP subassembly 118 to PNP home position 150.

Subsequently, actuator 140C enables TM subsystem 128 to move from TM home position 158 to active position 156 over semiconductor device 104 in socket 108. Actuator 140D causes TM head 132 to move down and exert pressure on semiconductor device 104. In some embodiments, TM subsystem 128 includes an opening for a removable fixture (not shown) attached by spring-loaded fasteners to TM head 132. In such embodiments, TM head 132 moves down under the power of actuator 140D, contacts printed circuit board 110 and stops further motion, while the fixture continues to move down. In some such embodiments, the spring-loaded fasteners enable TM subsystem 128 to maintain contact on printed circuit board 110. The fixture exerts increasing pressure on semiconductor device 104 by action of the spring-loaded fasteners until the predetermined pressure is reached, at which point actuator 140D shuts down and the Z-axis motion stops.

Figure 2B:
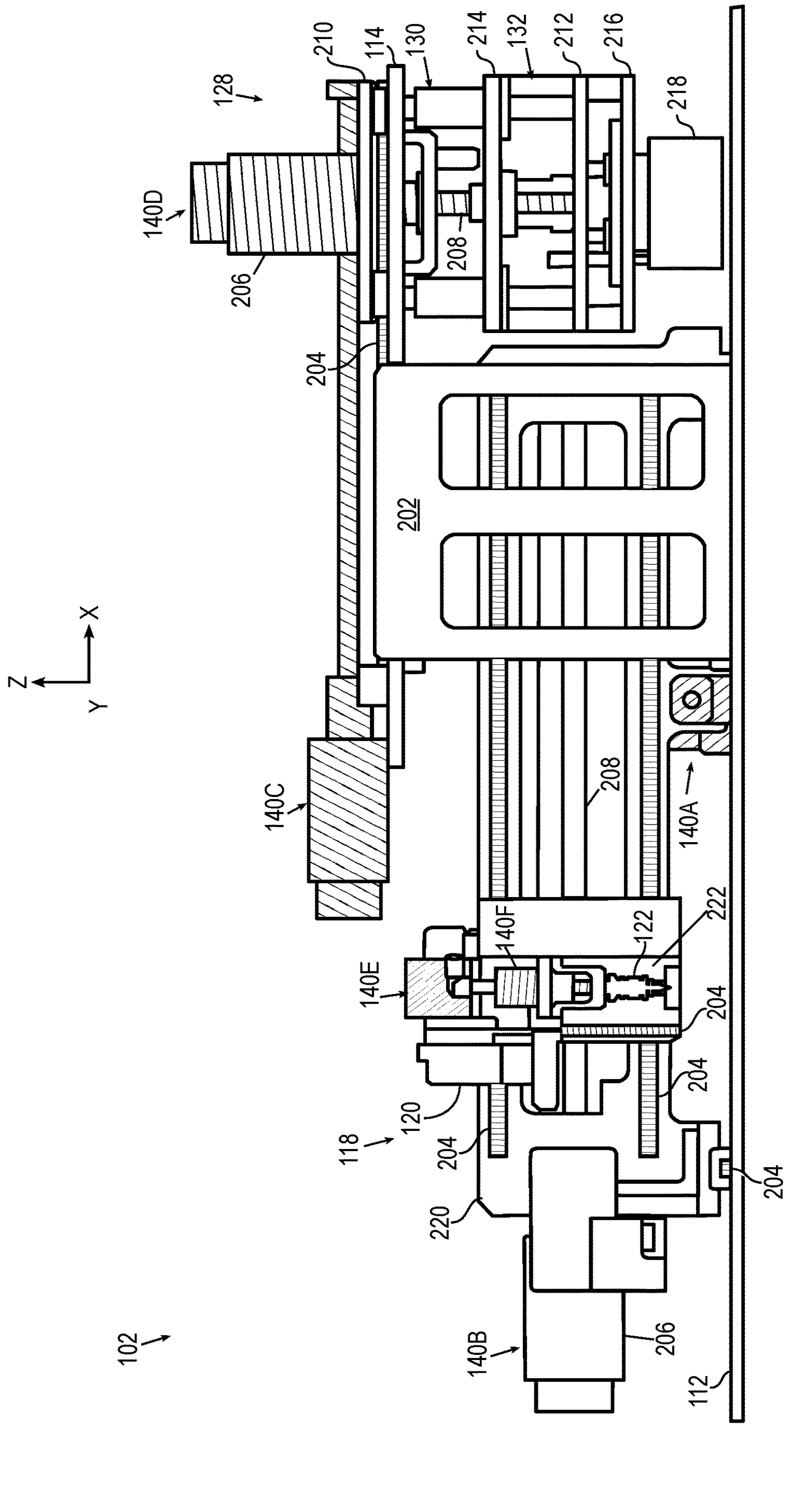

FIG. 2B is a simplified front view of handler 102 of FIG. 2A. TM subsystem 128 comprises TM carriage 130 and TM head 132. TM carriage 130 comprises a carriage top plate 210 configured to translate over rails 204 affixed to handler top plate 114. Motor 206 of actuator 140D is affixed to carriage top plate 210. TM carriage 130 further comprises a carriage bottom plate 212 parallel to and affixed to carriage top plate 210 at a distance therefrom. Lead screw 208 coupled to motor 206 of actuator 140D is attached to carriage bottom plate 212. The distance of carriage bottom plate 212 from carriage top plate 210 may be determined in some embodiments by the distance traveled by TM head 132 along the Z-axis (i.e., lead screw 208 coupled to motor 206 is long enough to enable the distance traveled by TM head 132).

TM head 132 comprises a TM head top plate 214 and a TM head bottom plate 216. TM head top plate 214 is between carriage top plate 210 and carriage bottom plate 212. TM head bottom plate 216 is between carriage bottom plate 212 and handler bottom plate 112 such that carriage bottom plate 212 is between TM head top plate 214 and TM head bottom plate 216. TM head top plate 214 is attached to a nut (not labeled) that translates on lead screw 208. Movement of the nut up and down lead screw 208 causes TM head 132 to move accordingly along with it along the Z-axis. TM head bottom plate 216 is parallel to and affixed to TM head top plate 214 at a distance therefrom.

A casing 218 is affixed by spring-loaded fasteners (not labeled) to TM head bottom plate 216 in some embodiments. In some embodiments, the spring-loaded fasteners enable casing 218 to maintain contact on printed circuit board 110. A removable fixture may also be attached by spring-loaded fasteners to TM head bottom plate 216. In such embodiments, as TM head 132 moves down under the power of actuator 140D, casing 218 initially contacts printed circuit board 110. Further motion downwards results in pressure exerted on printed circuit board 110 by the spring-loaded fasteners and continued movement of the fixture downwards over semiconductor device 104. When the predetermined pressure on semiconductor device 104 is reached, actuator 140D shuts off. At this point, casing 218 provides an enclosure around semiconductor device 104. The enclosure enables movement of air, for example, to remove frosting and/or condensation during cold/hot temperature testing. Unlike other handlers in the market that enclose the entire handler system within an enclosure for hot/cold testing, casing 218 may enable more efficient heat transfer and less energy wastage by confining the heated/cooled environment to within casing 218 around semiconductor device 104.

PNP subsystem 118 includes a PNP carriage 220, to which are affixed rails 204 that facilitate sliding of PNP head 120 along the X-axis. Actuator 140B that enables PNP head 120 to slide along the X-axis is also mounted to PNP carriage 220. Actuator 140B comprises servo motor 206 coupled with lead screw 208 in the embodiment shown. PNP carriage 220 includes a nut (not shown) that moves along lead screw 208 of actuator 140A, allowing sliding of PNP carriage 220 along the Y-axis. A PNP base plate 222 of PNP head 120 is slidably affixed to PNP carriage 220. PNP base plate 222 is provisioned with rails 204 on which PNP nozzle head 122 slides along the Z-axis. Sliding of PNP nozzle head 122 along the Z-axis is powered by actuator 140E. Rotation of PNP nozzle head 122 around the Z-axis is enabled by actuator 140F.

Figure 3:
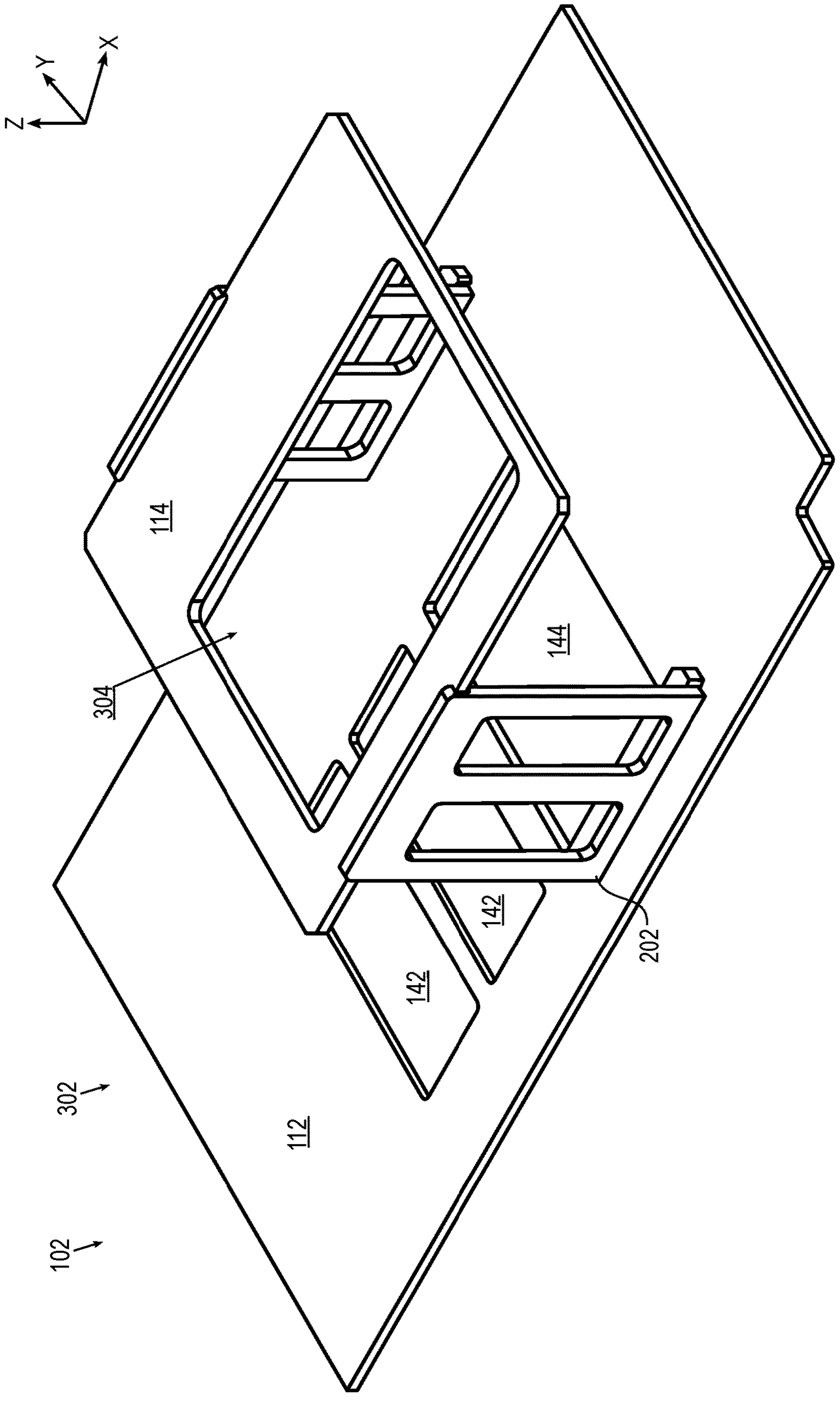
FIG. 3 is a simplified perspective view of another portion of an example system for handling semiconductor devices during testing.

FIG. 3 is a simplified perspective view of a frame 302 in handler 102 according to an embodiment of the present disclosure. Frame 302 comprises handler bottom plate 112, handler top plate 114 and handler side plates 202. Handler top plate 114 includes an opening 304 for movement of TM subsystem 128 from TM home position 158 to active position 156. Frame 302 may be made of any suitable material, including steel, aluminum, etc. as desired and based on particular needs.

Figure 4:
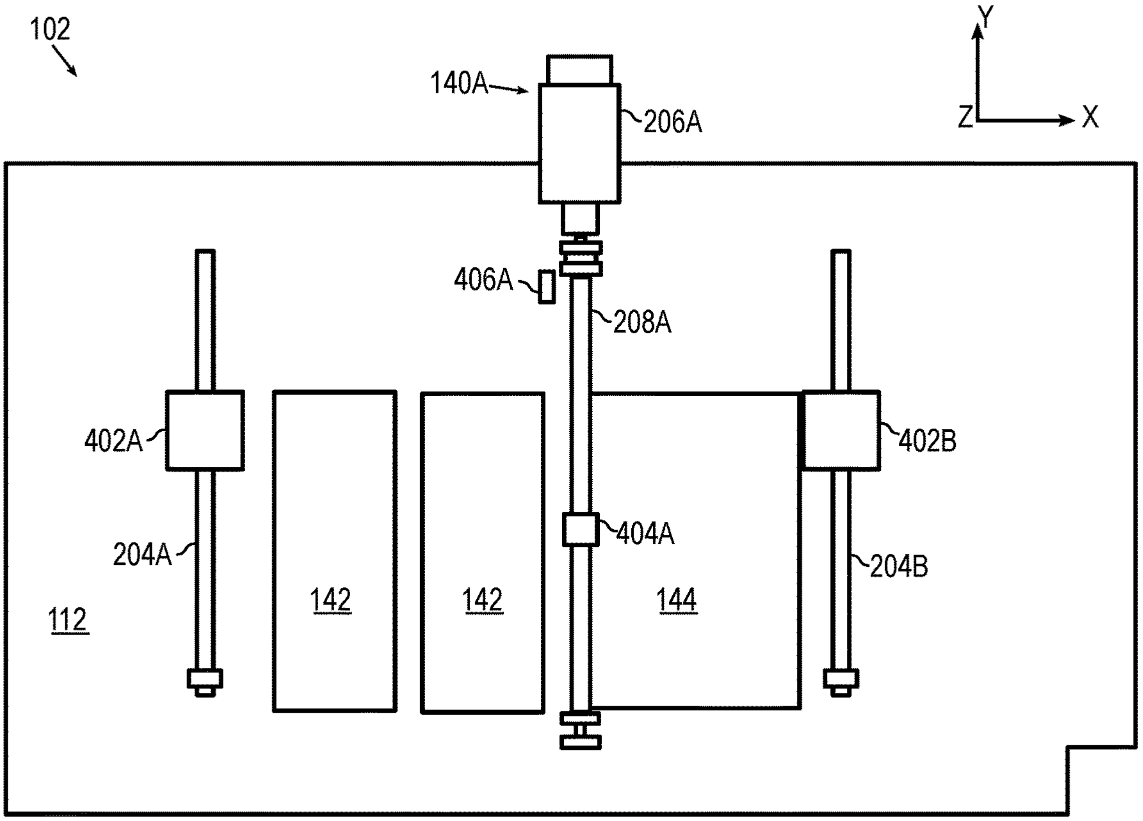
FIG. 4 is a simplified top view of yet another portion of an example system for handling semiconductor devices during testing.

FIG. 4 is a simplified top view of handler bottom plate 112 and additional components according to an embodiment of the present disclosure. Rail 204A and rail 204B are affixed to handler bottom plate 112. One or more slider 402 enables motion over rail 204. For example, slider 402A enables motion over rail 204A and slider 402B enables motion over rail 204B. Sliders 402A and 402B are affixed to PNP carriage 220 (not shown) so that PNP subsystem 118 moves over rails 204A and 204B along the Y-axis when activated by actuator 140A. Actuator 140A is fixed to handler bottom plate 112. In the embodiment shown, actuator 140A comprises servo motor 206A coupled with lead screw 208A. One end of lead screw 208A is coupled to servo motor 206A and the other end is fixed to handler bottom plate 112. A nut 404A moves along lead screw 208B, translating the rotary movement of lead screw 208A to linear motion along the Y-axis. Nut 404A is attached suitably to PNP carriage 220. Note that lead screw 208A may be supported suitably on bearings and other machine elements not shown with particularity to prevent clutter in the illustration. A proximity sensor 406A fixed to handler bottom plate 112 enables detecting a base position of PNP subsystem 118. In various embodiments, any proximity sensor 406 (including proximity sensor 406A) in handler 102 may be of any suitable construction; for example, proximity sensor 406A may be an optical reflective proximity sensor. Other types of sensors may be used in handler 102 without departing from the scope of the embodiments.

Distance traveled from the base position is calculated using the number of turns and angles rotated by servo motor 206A. A limit positioning sensor (not shown) may also be included in handler 102 without departing from the scope of the embodiments. In some embodiments, the limit position (i.e., maximum travel) may be determined by sensors integrated with actuator 140A; such sensors may identify the number of turns and angles of partial turns by servo motor 206A and compute the linear travel therefrom.

Figure 5:
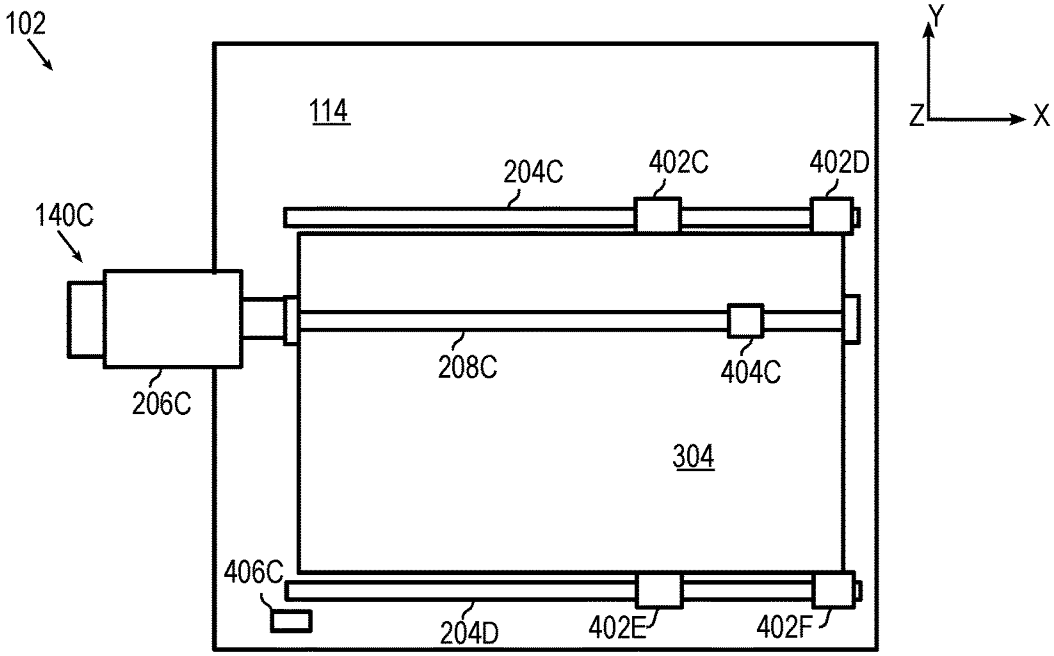
FIG. 5 is simplified top view of yet another portion of an example system for handling semiconductor devices during testing.

FIG. 5 is a simplified top view of handler top plate 114 and additional components according to an embodiment of the present disclosure. Rail 204C and rail 204D are affixed to handler top plate 114. Sliders 402C and 402D enable motion over rail 204C and sliders 402E and 402F enable motion over rail 204D. Sliders 402C-402F are affixed to TM carriage 130 (not shown) suitably so that TM carriage 130 moves over rails 204C and 204D along the X-axis when activated by actuator 140C. Actuator 140C is fixed to handler top plate 114. In the embodiment shown, actuator 140C comprises servo motor 206C coupled with lead screw 208C. One end of lead screw 208C is coupled to servo motor 206C and the other end is fixed to handler top plate 114. Nut 404C moves along lead screw 208C, translating the rotary movement of lead screw 208C to linear motion along the X-axis. Nut 404C is attached suitably to TM subsystem 128. Note that lead screw 208C may be supported suitably on bearings and other machine elements not shown with particularity to prevent clutter. Proximity sensor 406C fixed to handler top plate 114 enables detecting a base position of TM subsystem 128. Distance traveled from the base position is calculated using the number of turns and angles rotated by servo motor 206C. A limit positioning sensor (not shown) may also be included in handler 102 without departing from the scope of the embodiments. In some embodiments, the limit position (i.e., maximum travel) may be determined by sensors integrated with actuator 140C; such sensors may identify the number of turns and angles of partial turns by servo motor 206C and compute the linear travel therefrom.

Figure 6:
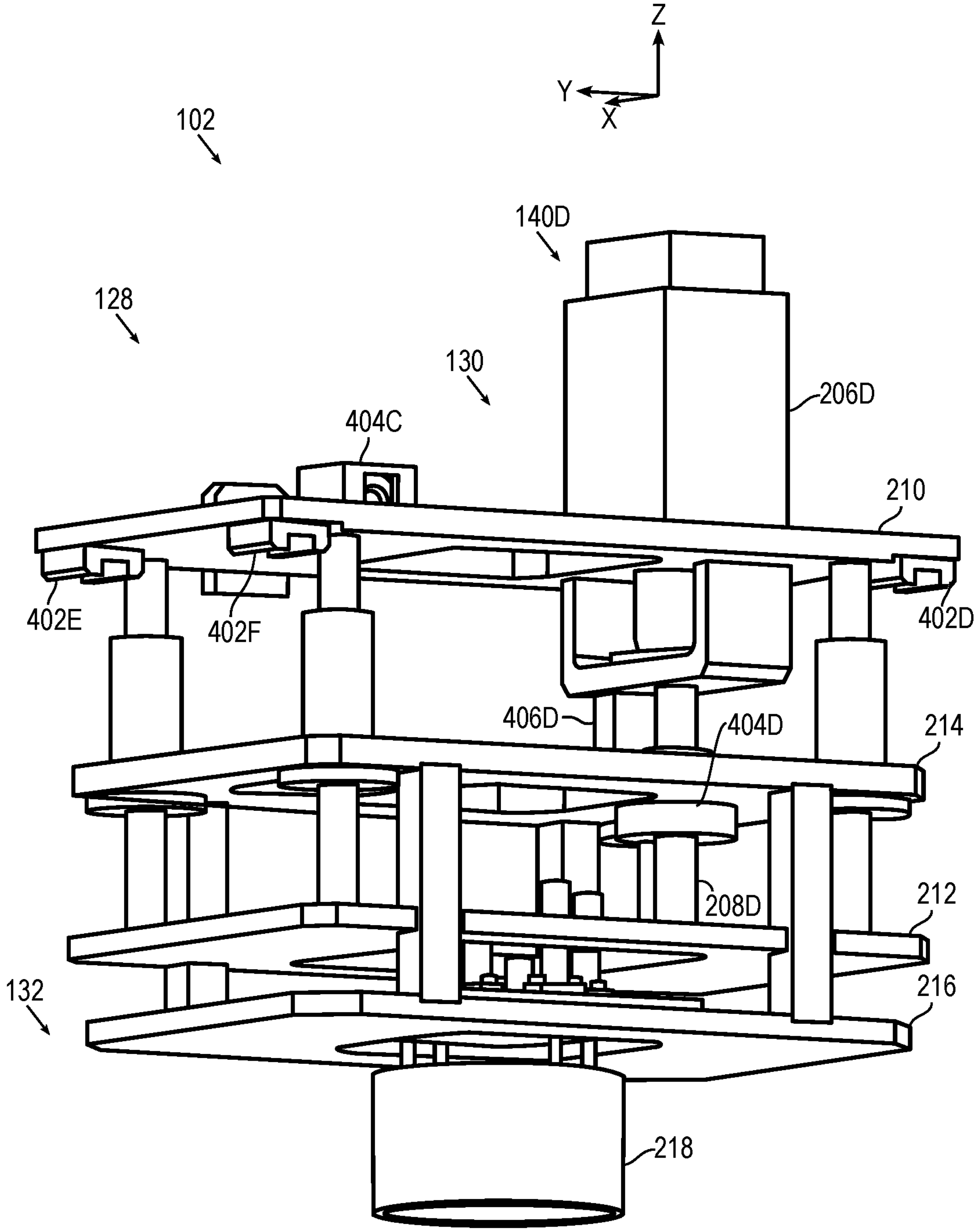
FIG. 6 is a simplified perspective view of yet another portion of an example system for handling semiconductor devices during testing.

FIG. 6 is a simplified perspective view of TM subsystem 128 according to an example embodiment. Nut 404C is affixed to top of carriage top plate 210, enabling TM carriage 130 to translate along the X-axis when lead screw 208C rotates. Sliders 402C-402F are affixed to bottom of carriage top plate 210, enabling TM carriage 130 to translate along the X-axis smoothly over rails 204C and 204D. TM subsystem 128 comprises TM carriage 130 that remains stationary with respect to the Z-axis and TM head 132 that is slidably coupled to TM carriage 130 for motion along the Z-axis. Motion of TM head 132 along the Z-axis is facilitated by actuator 140D. Actuator 140D is fixed to carriage top plate 210. In the embodiment shown, actuator 140D comprises servo motor 206D coupled with lead screw 208D. One end of lead screw 208D is coupled to servo motor 206D and the other end is fixed to carriage bottom plate 212. Nut 404D moves along lead screw 208D, translating the rotary movement of lead screw 208D to linear motion along the Z-axis. Nut 404D is affixed to TM head top plate 214, enabling TM head 132 to translate along the Z-axis when lead screw 208D rotates, while TM carriage 130 remains stationary with respect to the Z-axis. Proximity sensor 406D fixed to carriage top plate 210 enables detecting a base position of TM head 132. Distance traveled from the base position is calculated using the number of turns and angles rotated by servo motor 206D. A limit positioning sensor (not shown) may also be included in handler 102 without departing from the scope of the embodiments. In some embodiments, the limit position (i.e., maximum travel) may be determined by sensors integrated with actuator 140D; such sensors may identify the number of turns and angles of partial turns by servo motor 206D and compute the linear travel therefrom.

Figure 7:
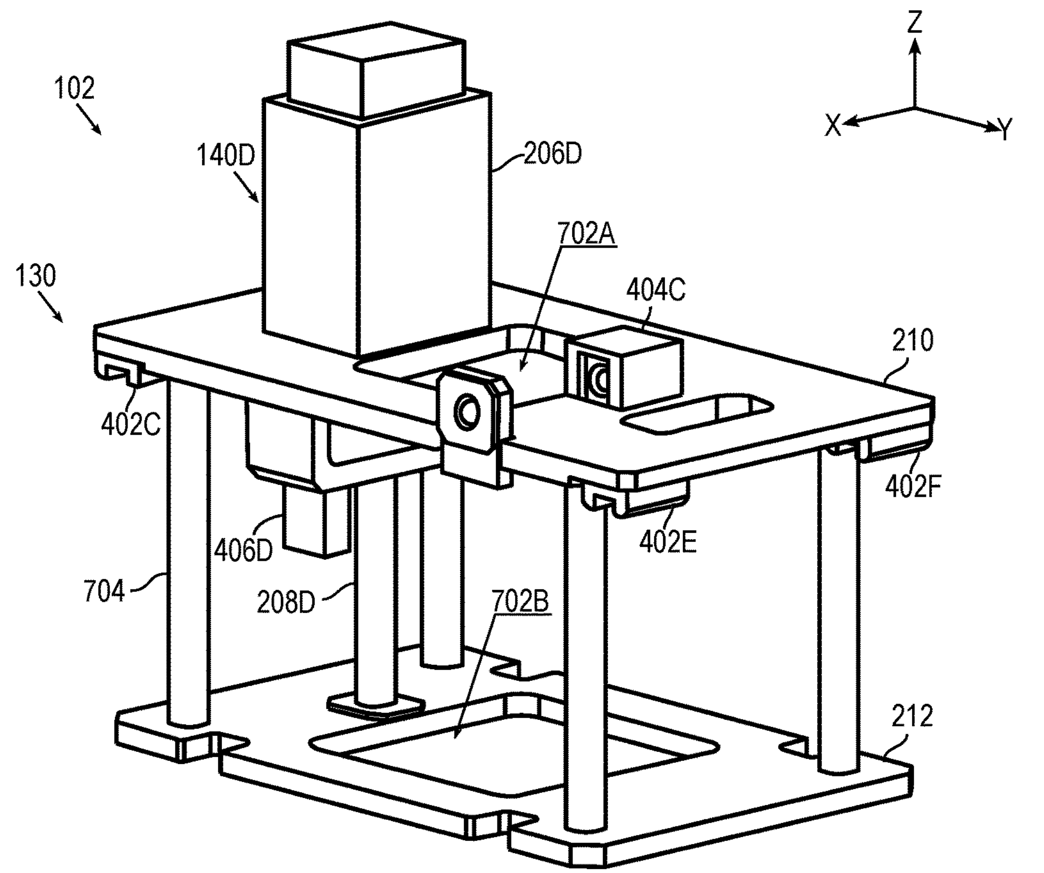
FIG. 7 is a simplified perspective view of yet another portion of an example system for handling semiconductor devices during testing.

FIG. 7 is a simplified perspective view of TM carriage 130 according to an example embodiment. TM carriage 130 includes an opening 702 for a removable fixture (not shown). Opening 702 in the embodiment shown comprises opening 702A in carriage top plate 210 and opening 702B in carriage bottom plate 212. Pillars 704 may fixedly couple carriage top plate 210 and carriage bottom plate 212. Pillars 704 may be of any suitable cross-sectional shape (e.g., circular, polygonal, square, etc.) within the broad scope of the embodiments herein. In various embodiments, pillars 704 may guide movement (e.g., sliding) of TM head 132 along the Z-axis. In some embodiments, pillars 704 may also absorb moment forces to prevent damage to lead screw 208D. Lead screw 208D is coupled to servo motor 206D fixed to carriage top plate 210 and to carriage bottom plate 212.

Figure 8:
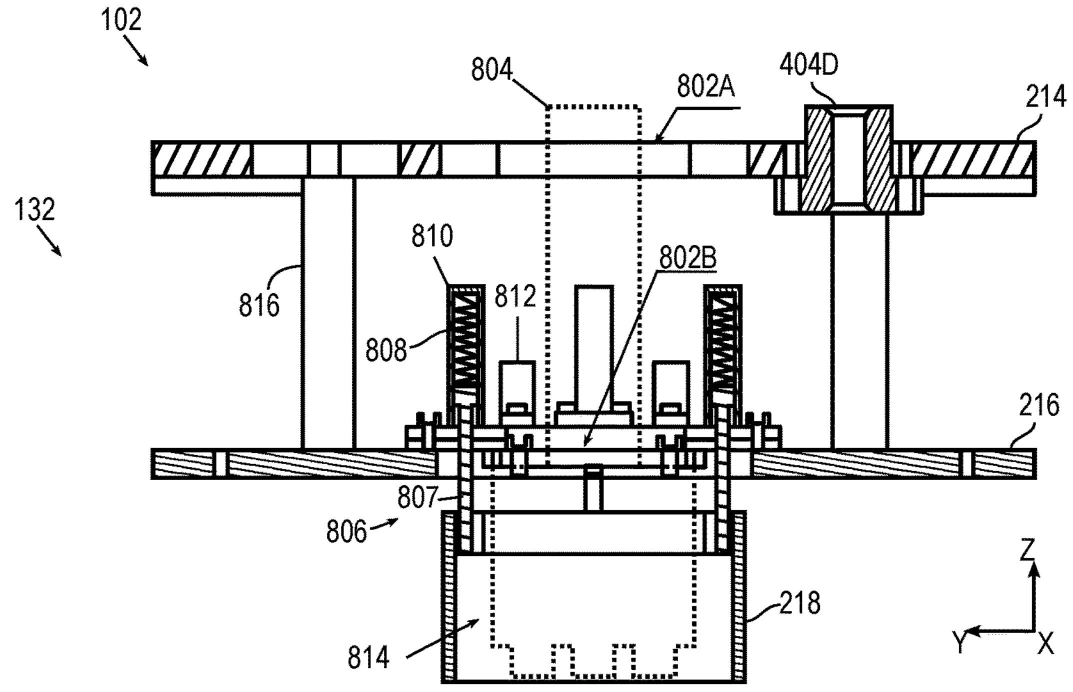
FIG. 8 is a simplified cross-sectional view of yet another portion of an example system for handling semiconductor devices during testing.

FIG. 8 is a simplified cross-sectional view of TM head 132 according to an example embodiment. Nut 404D is affixed to TM head top plate 214 to enable sliding of TM head 132 along Z-axis when lead screw 208D rotates under action by servo motor 206D. TM head 132 includes an opening 802 for a removable fixture 804 (shown in dotted lines). Opening 802 in the embodiment shown comprises opening 802A in TM head top plate 214 and opening 802B in TM head bottom plate 216. In some embodiments, fixture 804 comprises a mechanical head with ends shaped to fit into socket 108 and on semiconductor device 104 therein. In some other embodiments, fixture 804 comprises a thermal head configured to press down on semiconductor device 104 while simultaneously heating or cooling it appropriately. Fixture 804 may include hoses and/or cables that are not shown for ease of illustration and so as not to clutter the drawing.

Casing 218 is coupled to TM head bottom plate 216 by spring-loaded fasteners 806. Spring-loaded fastener 806 comprises a rod 807 having a head wider than its body, and a spring 808 in contact with the head between rod 807 and a cover 810. Spring 808 is hidden inside cover 810 and is made visible merely for illustrative purposes. Spring 808 may remain in an uncompressed state until the bottom of casing 218 contacts printed circuit board 110 (not shown). After contact with printed circuit board 110, further downward motion of TM head 132 causes rod 807 to move upwards, compressing spring 808 against cover 810, leading to a pressure force on printed circuit board 110. Similar spring-loaded fasteners 812 (shown covered, such that the springs are hidden under the cover) couple fixture 804 to TM head bottom plate 216. During operation, after casing 218 contacts printed circuit board 110, further downward motion of TM head 132 causes springs in similar spring-loaded fasteners 812 to compress, exerting pressure by fixture 804 on semiconductor device 104. The pressure exerted on printed circuit board 110 and semiconductor device 104 may be suitably assessed by the travel of casing 218 and fixture 804 respectively and the spring constant of the springs (e.g., 808) of spring-loaded fasteners 806 and 812.

Space 814 between casing 218 and fixture 804 enables movement of air around semiconductor device 104 during thermal heating/cooling operations. In various embodiments, handler 102 may facilitate heating to 155° C. and cooling to −55° C. The air circulation inside casing 218 may prevent frosting on printed circuit board 110 and semiconductor device 104 during cold temperature testing. The air circulation may also remove moisture, and prevent local thermal hot spots or cold spots during heating or cooling, facilitating efficient heat transfer within casing 218. Casing 218 may also prevent injury to the human operator during hot temperature testing by providing a barrier between the heated environment and the environment external to handler 102. Pillars 816 may fixedly couple TM head top plate 214 and TM head bottom plate 216. Pillars 816 may be of any suitable cross-sectional shape (e.g., circular, polygonal, square, etc.) within the broad scope of the embodiments herein.

Figure 9:
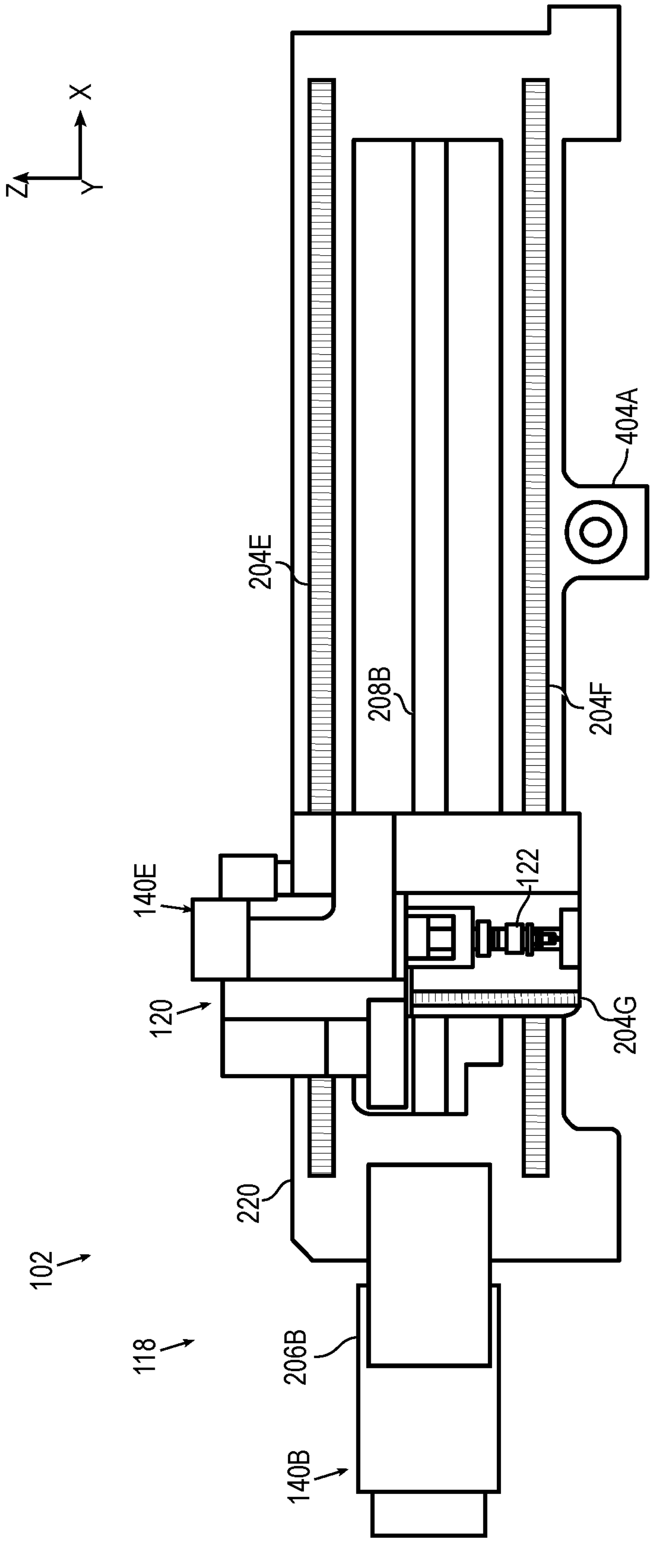
FIG. 9 is a simplified front view of yet another portion of an example system for handling semiconductor devices during testing.

FIG. 9 is a simplified front view of PNP subsystem 118 of handler 102 according to an example embodiment. PNP subsystem 118 includes PNP carriage 220, to which are affixed rails 204E and 204F that facilitate sliding of PNP head 120 along the X-axis. Actuator 140B that enables PNP head 120 to slide along the X-axis is fixed to PNP carriage 220. Actuator 140B comprises servo motor 206B coupled with lead screw 208B in the embodiment shown. One end of lead screw 208B is coupled to servo motor 206B and the other end is fixed to PNP carriage 220. PNP carriage 220 includes nut 404A that moves along lead screw 208A (not shown) of actuator 140A (not shown), allowing sliding of PNP carriage 220 along the Y-axis. PNP base plate 222 of PNP head 120 is affixed to PNP carriage 220. PNP base plate 222 is provisioned with rails 204G and 204H (not shown) on which PNP nozzle head 122 slides along the Z-axis. Sliding of PNP nozzle head 122 along the Z-axis is powered by actuator 140E. Rotation of PNP nozzle head 122 around the Z-axis is enabled by actuator 140F (not shown). Other components that are not visible in the figure include sensors 406, sliders, nuts, etc. in PNP subsystem 118.

Figure 10:
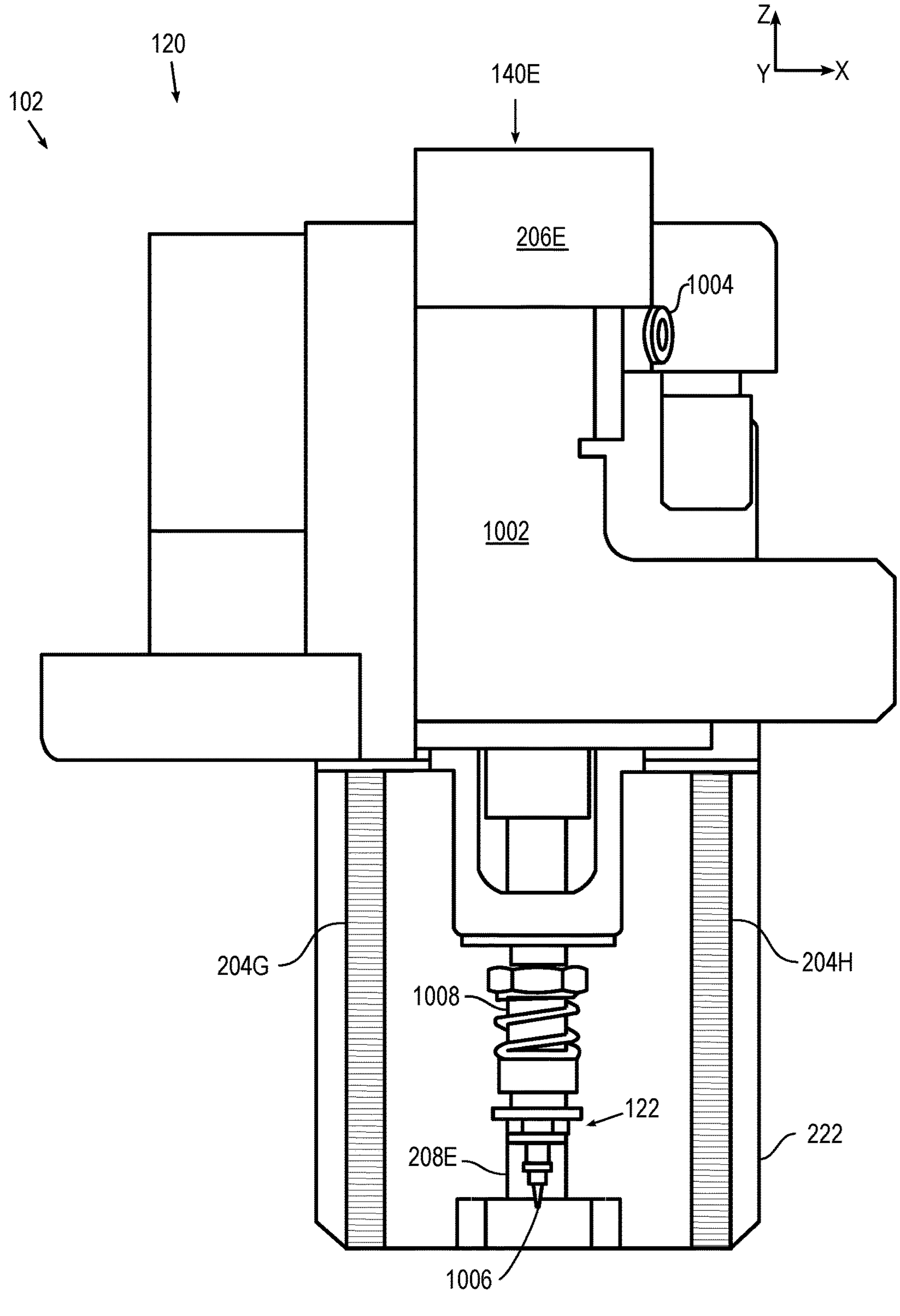
FIG. 10 is a simplified front view of yet another portion of an example system for handling semiconductor devices during testing.

FIG. 10 is a simplified front view of PNP head 120 according to an example embodiment. PNP head 120 includes rails 204G and 204H fixed to PNP base plate 222 to enable PNP nozzle head 122 to slide along the Z-axis. A support plate 1002 provides support for an elbow coupler 1004 that facilitates providing vacuum to PNP nozzle head 122. A hollow tube (not shown) such as a vacuum hose is coupled to elbow coupler 1004. Actuator 140E comprises stepper motor 206E and a lead screw 208E in some embodiments. PNP nozzle head 122 slides along the Z-axis facilitated by actuator 140E that is fixed to PNP base plate 222. A PNP nozzle 1006 is coupled to elbow coupler 1004 through a hollow shaft 1008. Hollow shaft 1008 may facilitate providing vacuum suction on demand at PNP nozzle 1006.

Figure 11:
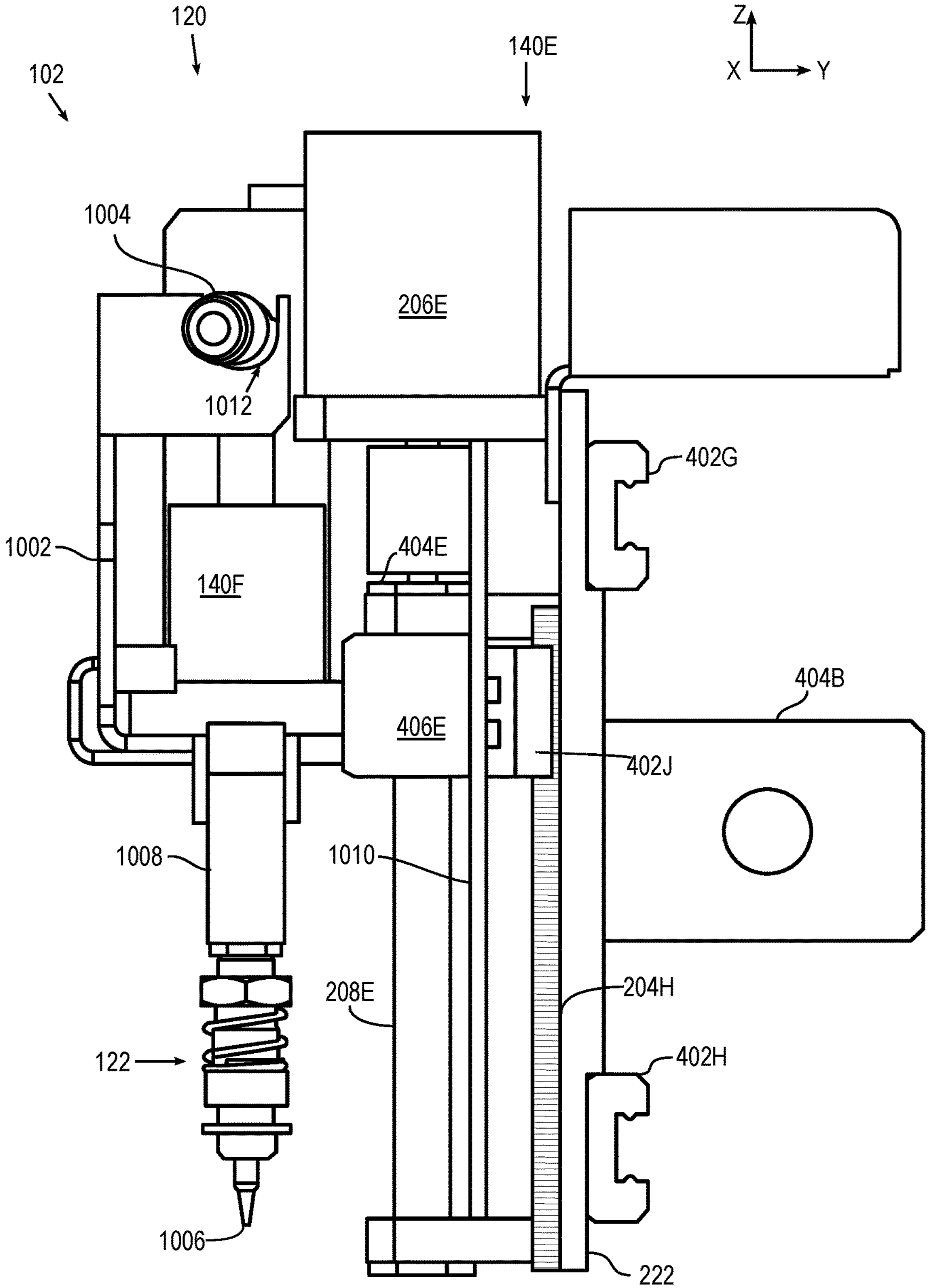
FIG. 11 is a simplified side view of the portion of the example system illustrated in FIG. 10.

FIG. 11 is a simplified side view of PNP head 120 according to an example embodiment. A nut 404B is attached to PNP base plate 222 on a side of PNP base plate 222 opposite to PNP nozzle head 122. Nut 404B enables PNP head 120 to slide along the X-axis on lead screw 208B of actuator 140B (see FIG. 9). Sliders 402G, 402H (and corresponding other sliders not visible in the view shown) on the side of PNP base plate 222 opposite to PNP nozzle head 122 enable PNP head 120 to slide on rails 204E and 204F (see FIG. 9).

PNP nozzle head 122 slides along the Z-axis facilitated by actuator 140E that is fixed to PNP base plate 222. Actuator 140E comprises stepper motor 206E coupled to lead screw 208E. One end of lead screw 208E is coupled to stepper motor 206E and the other end is fixed to PNP base plate 222. PNP nozzle head 122 is attached to nut 404E that slides on lead screw 208E, converting rotation of stepper motor 206E and lead screw 208E to sliding along the Z-axis. On the side of PNP base plate 222 proximate to PNP nozzle 1006, rails 204G (not visible) and 204H enable PNP nozzle head 122 to move up and down along the Z-axis. Sliders 402J (and corresponding other sliders not visible in the view shown) enable sliding of PNP nozzle head 122 on rails 204G and 204H.

Proximity sensor 406E fixed to PNP base plate 222 allows detection of the position of PNP nozzle head 122 along the Z-axis. Note that in the figure, although it may appear that proximity sensor 406E is attached to slider 402J, such is not the case and is merely an artefact of the view shown. Proximity sensor 406E is attached to another plate 1010 that is stationary relative to PNP base plate 222. A limit positioning sensor (not shown) may also be included without departing from the scope of the embodiments. In some embodiments, the limit position (i.e., maximum travel) may be determined by sensors integrated with actuator 140E; such sensors may identify the number of steps, turns and angles of partial turns or steps by stepper motor 206E and compute the linear travel therefrom.

Actuator 140F is fixed to PNP nozzle head 122 so that actuator 140F slides with PNP nozzle head 122 along the Z-axis. Actuator 140F enables PNP nozzle 1006 to rotate around the Z-axis. When PNP nozzle 1006 rotates, hollow shaft 1008 that is coupled to PNP nozzle 1006 also rotates. Hollow shaft 1008 passes through actuator 140F, which is a hollow-shaft motor in the embodiment shown. In some other embodiments, hollow shaft 1008 and actuator 140F may be independently connected to PNP nozzle head 122; in such embodiments, actuator 140F may be a theta-motor with a non-hollow shaft. In various embodiments, actuator 140F may also include one or more sensors for determining the angle of rotation of PNP nozzle head 122 and controlling the rotation of the theta-motor based on the determination.

Support plate 1002 includes a cutout 1012 in which elbow coupler 1004 is positioned. Cutout 1012 prevents elbow coupler 1004 from rotating. Hollow shaft 1008 is connected to elbow coupler 1004. Rotation of hollow shaft 1008 with PNP nozzle 1006 would cause elbow coupler 1004 also to rotate, which would lead to entanglement of the vacuum hose (not shown) connected to elbow coupler 1004. However, cutout 1012 prevents such entangling by preventing elbow coupler 1004 from rotating when PNP nozzle 1006 rotates.

Figure 12:
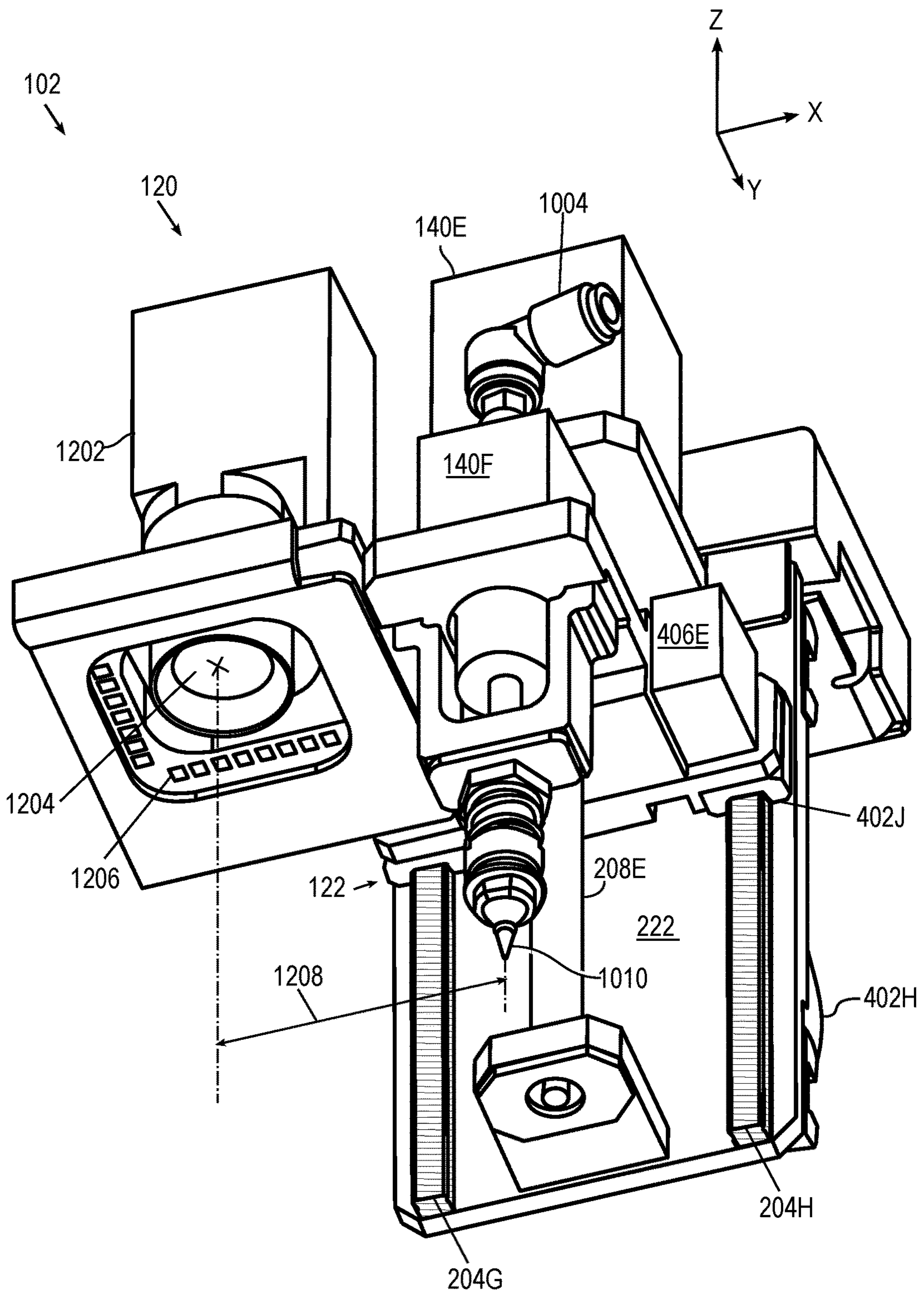
FIG. 12 is a simplified perspective view of the portion of the example system illustrated in FIG. 10.

FIG. 12 is a simplified perspective bottom view of PNP head 120 according to an example embodiment. PNP nozzle head 122 comprises PNP nozzle 1006 and a vision head 1202 having a camera 1204 above one or more flash LED 1206. Vision head 1202 is coupled to PNP nozzle head 122 so that it slides along the Z-axis along with PNP nozzle head 122. Vision head 1202 is decoupled from PNP nozzle 1006 so that vision head 1202 does not rotate when PNP nozzle 1006 rotates around the Z-axis. Vision head 1202 is at an offset 1208 from PNP nozzle 1006 in the X-Y plane. In some embodiments, offset 1208 may be solely along the X-axis; in some other embodiments, offset 1208 may be solely along the Y-axis; in yet other embodiments, offset 1208 may be along both the X-axis and the Y-axis. Camera 1204 may be offset along the Z-axis from the tip of PNP nozzle 1006 as well. In some embodiments, camera 1204 may be replaced with other similarly sized cameras having different resolutions based on the range of sizes of semiconductor device 104 to be tested. Note that the illustration does not show plate 1010 in order to render rails 204H visible.

In various embodiments, vision head 1202 is configured to recognize (e.g., distinguish, identify, etc.) semiconductor device 104 from its surroundings. Such recognizing may be by any suitable image processing algorithms beyond the scope of the present disclosure. During operation, vision head 1202 may be used to calibrate the motions of PNP subsystem 118. In a particular embodiment, vision head 1202 is brought approximately close to the vicinity of active position 50 and is configured to identify semiconductor device 104 in tray 106, including its alignment in tray 106. One or more flash LED 1206 enables shining light on the field of vision of camera 1204 during such identification operations. Camera 1204 may determine any linear misalignment of semiconductor device 104 inside tray 106. Since offset 1208 is known beforehand, after semiconductor device 104 is identified, PNP head 120 may be moved by offset 1208 and any linear misalignment identified by camera 1204 to bring PNP nozzle 1006 over center of semiconductor device 104 in tray 106. Actuator 140E is activated to move PNP nozzle head 122 down by the Z-offset to pick up semiconductor device 104 from tray 106. Camera 1204 further enables determining any angular misalignment of semiconductor device 104 with respect to socket 108. Actuator 140F is activated to rotate PNP nozzle 1006 suitably so that the angular misalignment is removed between semiconductor device 104 and socket 108.

Thereafter, PNP head 120 is moved approximately close to the vicinity of active position 156 and adjusted to align vision head 1202 over socket 108. After active position 56 is identified, including the Z-offset (e.g., depth) of socket 108 from PNP nozzle head 122, PNP head 120 is moved to place PNP nozzle head 122 over socket 108. Actuator 140E is activated to move PNP nozzle head 122 down by the appropriate distance determined by vision head 1202 previously to place semiconductor device 104 in socket 108 appropriately.

Thereafter, vision head 1202 is used to identify various sites for active position 154. After testing is completed on semiconductor device 104, the specific site of active position 154 is provided to handler 102 by tester 160, for example, based on the sorting bin of semiconductor device 104 according to test results so that vision head 1202 is next moved approximately to the vicinity of active position 154. After identifying the exact position in tray 106 to which semiconductor device 104 is to be returned, PNP nozzle head 122 is moved suitably to place semiconductor device 104 in tray 106 according to the test bin/sorting results. In various embodiments, vision head 1202 is used during setup operations, to determine distances to be traversed by PNP head 120 before semiconductor device 104 is tested. After setup operations are completed, and active positions 150-156 are identified, testing operations commence, during which time vision head 1202 is not used further unless necessary.

Figure 13:
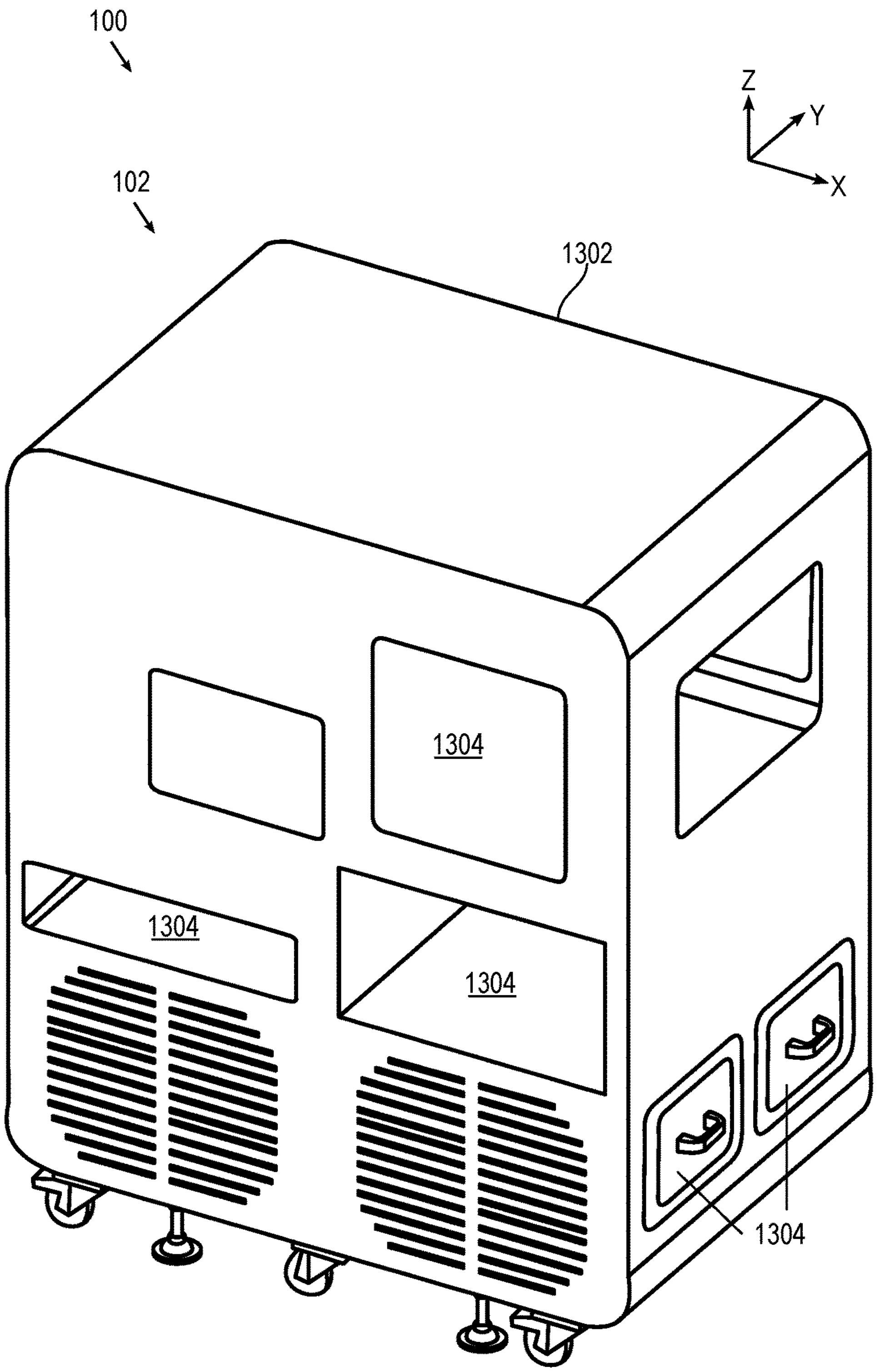
FIG. 13 is a simplified perspective view of an example engineering handler in a system for handling semiconductor devices during testing.

FIG. 13 is a simplified perspective view of handler 102 in an engineering configuration according to an example embodiment. A housing 1302 covers the mechanisms described in preceding FIGS. 1-12 within an enclosure 1304 that is provided with a plurality of windows for a human operator to see the operations. Additional enclosures 1304 are also provided in housing 1302, for example, to accommodate thermal systems, vacuum systems, testing instruments, and other ancillary subsystems that enable suitable operation by handler 102. Note that the configuration shown in the figure is merely an example and is not to be construed as a limitation. Various other configurations housing the mechanisms described herein are included within the broad scope of the embodiments herein.

In some embodiments, handler bottom plate 112 may rest on a shelf in enclosure 1304 of housing 1302. The shelf may have an opening corresponding to test opening 144. Printed circuit board 110 may be mounted underneath the shelf in test opening 144 so that socket 108 is exposed through test opening 144. In some such embodiments, printed circuit board 110 may be screwed or otherwise fastened to the shelf suitably.

Figure 14:
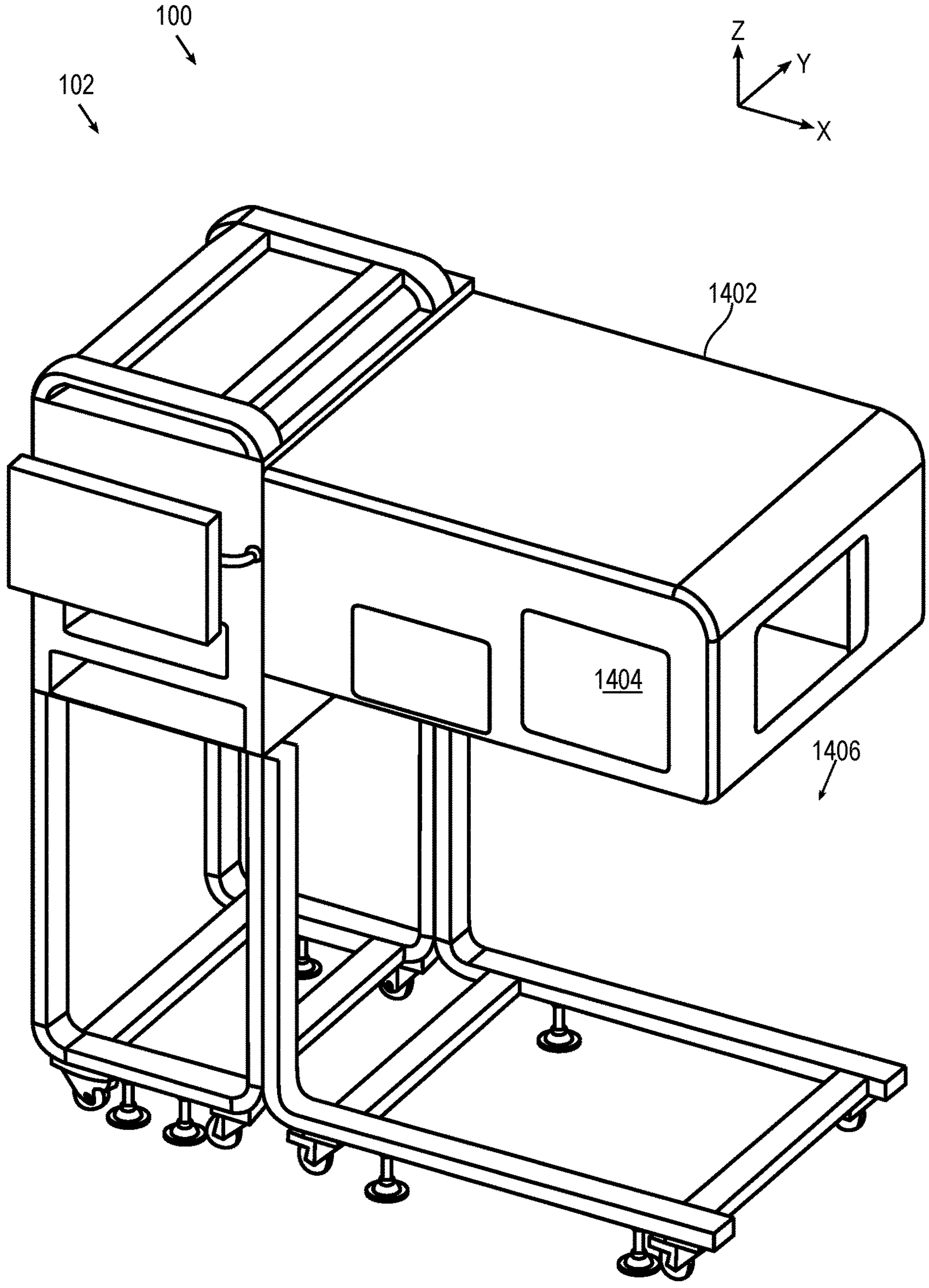
FIG. 14 is a simplified perspective view of an example production handler in a system for handling semiconductor devices during testing.

FIG. 14 is a simplified perspective view of handler 102 in a production configuration according to an example embodiment. A housing 1402 covers the mechanisms described in preceding FIGS. 1-12 within an enclosure 1404 that is provided with a plurality of windows for a human operator to see the operations. A space 1406 is provided underneath enclosure 1404 to accommodate tester 160. Tester 160 docks to handler 102 in space 1406. Printed circuit board 110 is attached to tester 160 mechanically and electrically. In the docked position, tester 160 is suitably aligned to expose printed circuit board 110 on tester 160 through test opening 144 of handler 102. In some such embodiments, the docking enables mechanical and electrical coupling of tester 160 and handler 102.

During production, a human operator (or robotic machine) may place one or more trays 106 from a conveyor belt into tray recess 142 within enclosure 1404. Tester 160 may be docked in space 1406 during the duration of the production line operations. After testing is completed, and tester 160 is no longer needed, tester 160 may be de-docked from space 1406 suitably. Note that the configuration shown in the figure is merely an example and is not to be construed as a limitation. Various other configurations housing the mechanisms described herein are included within the broad scope of the embodiments herein.

Figure 15:
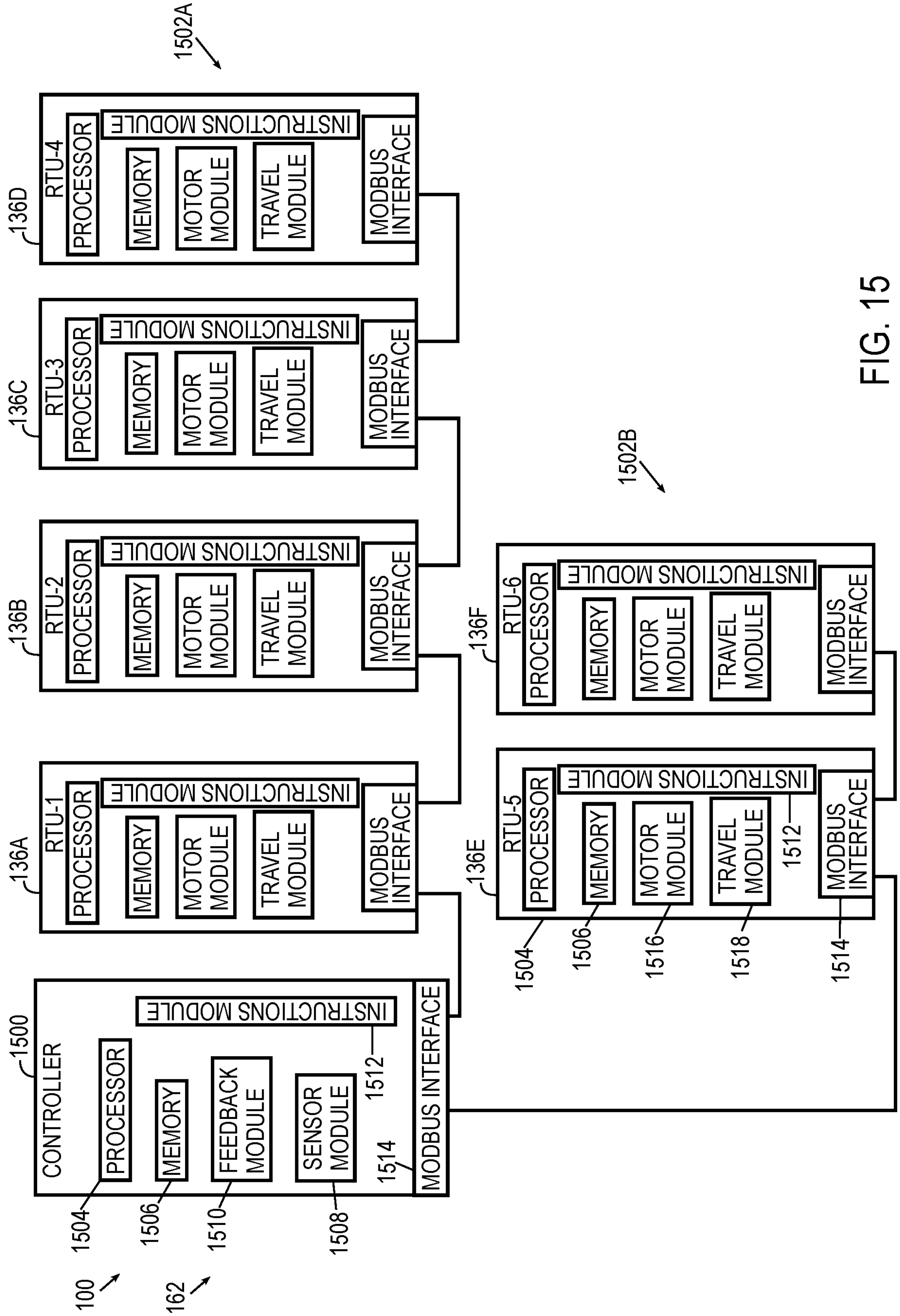
FIG. 15 is a simplified block diagram of a control system in an example system for handling semiconductor devices during testing.

FIG. 15 is a simplified block diagram illustrating control system 162 in system 100 according to an example embodiment. Control system 162 comprises a controller 1500 coupled in a wiring scheme 1502 to a plurality of RTUs 136, for example, RTUs 136A-136F. Each RTU 136A-136F controls a separate one of actuator 140 in the embodiment shown. In other embodiments, one RTU 136 may control more than one actuator 140. In the example embodiment shown, wiring scheme 1502 comprises two separate daisy chains 1502A and 1502B. In other embodiments, RTUs 136 may be connected to controller 1500 by wiring scheme 1502 comprising a single daisy chain. In yet other embodiments, RTUs 136 may be connected to controller 1500 by wiring scheme 1502 comprising a star configuration. The daisy chain may simplify wiring in handler 102 but may add additional complexity to the embedded control algorithms. The star configuration may be simple in terms of the embedded control algorithms but may present a challenge in wiring within handler 102. The choice of wiring scheme 1502 used to connect RTUs 136 with controller 1500 may be based on various needs beyond the scope of the present disclosure. In yet other embodiments, the functionalities of all RTUs 136 may be included in controller 1500 with wiring scheme 1502 being internal to controller 1500 without departing from the scope of the disclosure.

Controller 1500 may include a processor 1504, a memory 1506, a sensor module 1508, a feedback module 1510, an instructions module 1512 and a MODBUS interface 1514 (among other components). Processor 1504 may execute any type of instructions associated with data stored in memory 1506 to achieve the operations detailed herein. In one example, processor 1504 may transform data from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., field programmable gate array (FPGA), an erasable programmable read only memory (EPROM), an application specific integrated circuit (ASIC)) that includes digital logic, software, code, electronic instructions, flash memory, optical disks, magnetic or optical cards, other types of machine-readable mediums suitable for storing electronic instructions, or any suitable combination thereof.

In some of example embodiments, memory 1506 may store data used for the operations described herein. This includes memory 1506 storing instructions (e.g., software, logic, code, etc.) in non-transitory media (e.g., random access memory (RAM), read only memory (ROM), FPGA, EPROM, etc.) such that the instructions are executed to carry out the activities described in this disclosure based on particular needs. In some embodiments, memory 1506 may comprise non-transitory computer-readable media, including one or more memory devices such as volatile memory such as dynamic RAM (DRAM), nonvolatile memory (e.g., ROM), flash memory, solid-state memory, and/or a hard drive. In some embodiments, memory 1506 may share a die with processor 1504. Memory 1506 may include algorithms, code, software modules, and applications, which may be executed by processor 1504. The data being tracked, sent, received, or stored in system 100 may be provided in any database, register, table, cache, queue, control list, or storage structure, based on particular needs and implementations, all of which could be referenced in any suitable timeframe.

The example network may be configured over a physical infrastructure that may include one or more networks and, further, may be configured in any form including, but not limited to, local area networks (LANs), wireless local area networks (WLANs), virtual local area networks (VLANs), metropolitan area networks (MANs), wide area networks (WANs), virtual private networks (VPNs), Intranet, Extranet, any other appropriate architecture or system, or any combination thereof that facilitates communications in a network. In some embodiments, a communication link may represent any electronic link supporting a LAN environment such as, for example, cable, Ethernet, wireless technologies (e.g., IEEE 802.11x), ATM, fiber optics, etc. or any suitable combination thereof. In other embodiments, communication links may represent a remote connection through any appropriate medium (e.g., digital subscriber lines (DSL), telephone lines, T1 lines, T3 lines, wireless, satellite, fiber optics, cable, Ethernet, etc. or any combination thereof) and/or through any additional networks such as a WANs (e.g., the Internet). To this end, each of controller 1500 and RTUs 136 may be configured with the appropriate communication interfaces and circuitry for the appropriate functionalities.

Sensor module 1508 may receive electrical signals from sensors in one or more actuator 140, proximity sensor 406, vision head 1202, and other sensors in system 100. In some embodiments, the electrical signals may be received directly from the sensors; in other embodiments, the electrical signals from the sensors may be routed through one or more RTUs 136. The electrical signals may comprise current and/or voltage representing the position, speed and direction of rotating motor 206, position of one or more nuts 404, orientation and position of PNP nozzle 1006, etc. For example, in some embodiments, motors 206 of actuators 140 may be equipped with sensors that detect the number of turns and angle of rotation of the motor; electrical signals from these sensors may be received at sensor module 1508. Feedback module 1510 analyzes the received electrical signals and determines various courses of action, such as stop, move, rotate, etc. for actuators 140. Instructions module 1512 may receive instructions from tester 160, and/or generate instructions for RTUs 136 suitably based on the analysis results by feedback module 1510.

MODBUS interface 1514 comprises circuitry to enable communication using MODBUS protocol. MODBUS protocol is a client/server data communications protocol in the application layer of the Open Systems Interconnection model (OSI model). MODBUS protocol uses serial communication lines, Ethernet, or Internet Protocol (IP) suite as a transport layer. MODBUS protocol supports communication to and from multiple devices connected to the same communication network. In embodiments herein, RTUs 136 are connected to the same communication network managed by controller 1500 over MODBUS interface 1514. The various RTUs 136 comprise clients in the client/server paradigm, while controller 1500 functions as the server. MODBUS interface 1514 comprises the various communication layers, modules and circuitry to enable the MODBUS protocol. Note that MODBUS protocol is merely one example communication protocol that may be used in system 100. Other communication protocols may also be used without departing from the scope of the embodiments. MODBUS interface 1514 may be modified according to the specific communication protocol used in the network.

Each one of RTUs 136 may comprise various components, including processor 1504, memory 1506, feedback module 1510, and MODBUS interface 1514. In addition, other components include a motor module 1516 and a travel module 1518. Motor module 1516 may control all aspects of motors 206 to which the respective RTU 136 is coupled, including powering the motor, controlling its speed and acceleration, and identifying its base position. Travel module 1518 may determine the distance traveled as enabled by the motor's rotation, including counting the number of rotations of the motor, identifying the angle of partial rotation, etc. Note that RTUs 136 may each comprise modules similar to the other RTUs 136 in functionalities according to some embodiments. In other embodiments, RTUs 136 may comprise modules different from other RTUs in structure and functionalities. For example, RTUs 136 may be off-the-shelf, with some RTUs 136 by one manufacturer, and other RTUs 136 by other manufacturers. In some such embodiments, each module within any one RTU 136 may have a different electrical circuit structure compared to corresponding modules in other RTUs 136 without departing from the scope of the embodiments. Further, in some embodiments, some RTUs 136 may have more or less modules/components than other RTUs 136 in system 100 without departing from the scope of the embodiments.

In an example operation, sensor module 1508 receives electrical signals from proximity sensors 406. Based on the electrical signals, feedback module 1510 determines that PNP subsystem 118 and TM subsystem 128 are at respective home positions 150 and 158 with all respective movable components (e.g., PNP head 120, PNP nozzle head 122, TM carriage 130, and TM head 132) at base positions. Thereafter, instructions module 1512 in controller 1500 receives instructions from tester 160 to commence testing. Instructions module 1512 in controller 1500 generates instructions to RTUs 136A, 136B, 136E, and 136F to move to active position 152, pick up semiconductor device 104, rotate semiconductor device 104 suitably, move to active position 156, and place semiconductor device 104 in socket 108.

The instructions to RTUs 136A, 136B, 136E, and 136F are sent over MODBUS interface 1514 in controller 1500 suitably and received at respective RTUs 136 over corresponding MODBUS interface 1514 in the individual RTUs 136. Each RTU 136 may direct the respective actuator 140 under its control to carry out the received instructions. The movements of PNP subsystem 118 are monitored by the appropriate sensors in respective actuators 140A, 140B, 140E, and 140F and controlled independently by corresponding RTUs 136A, 136B, 136E, and 136F. Thereafter, instructions module 1512 in controller 1500 may direct PNP subsystem 118 to return to PNP home position 150. Subsequently, instructions module 1512 in controller 1500 may generate corresponding instructions to RTUs 136, which may activate respective actuators 140 and facilitate returning PNP subsystem 118 to PNP home position 150. Similar operations may enable moving TM subsystem 128 between TM home position 158 and active position 156, for example, by suitably activating actuators 140C and 140D by RTU 136C and 136D, respectively.

Note that the above example is merely one of many examples and is not to be construed as a limitation. Various other such operations to adjust positions of one or more components of handler 102 may be controlled by controller 1500 and various ones of RTUs 136 and all such operations are contemplated and included within the broad scope of the embodiments herein. Further control system 162 may comprise other modules, data, circuits, and components not illustrated in FIG. 15 for lack of relevancy to the explanation herein. Some such components not illustrated in FIG. 15 may be illustrated and described in other figures in this disclosure without departing from the scope of the embodiments.

Figure 16:
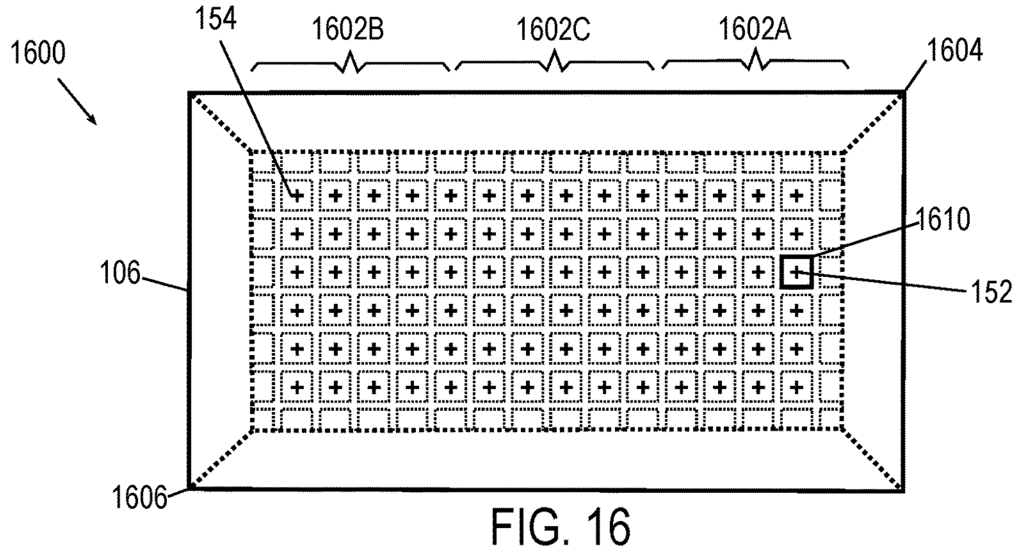
FIG. 16 is a simplified top view of various templates in an example system for handling semiconductor devices during testing.

FIG. 16 is a simplified top view of a tray template 1600 representative of tray 106 according to an example embodiment. Tray template 1600 is a virtual representation of tray 106, or a type of tray 106. Note that tray 106 shown and illustrated is merely as containing a plurality of receptacles for one or more of semiconductor device 104 and is not to be construed as a limitation. Any suitable configuration for holding semiconductor device 104 may be mapped to tray template 1600 in system 100 without departing from the scope of the various embodiments. In the example shown, tray 106 is a waffle JEDEC tray configured to place several semiconductor devices 104 in a matrix arrangement, i.e., in rows and columns. The intersections of rows and columns represent receptacles to hold semiconductor device 104. In other words, a specific receptacle in template 1600 may be represented by the intersection of a specific row and a specific column. In some embodiments, each receptacle is represented by its respective center points, shown as crosses in the illustration. Each such center point thus represents a possible location for semiconductor device 104.

In some other embodiments, one or more coordinates may represent a specific location in tray template 1600. In some such embodiments, the coordinates may be rows and columns; in other such embodiments, the coordinates may be X-coordinates and Y-coordinates, measured from an origin (e.g., represented by a corner of tray template 1600). According to various embodiments, controller 1500 may classify subsets of the rows and columns into different zones 1602. In some such embodiments, tray 106 may be mapped into tray template 1600 as one or more zones 1602, for example, 1602A, 1602B, and 1602C. Each zone 1602 may be identified as having a specific number of center points (i.e., receptacles) or rows and columns. In various embodiments, zones 1602 may be mutually exclusive and may not overlap.

In some embodiments, semiconductor device 104 may be represented as a device template 1610 (shown with continuous lines) having a specified boundary of known dimensions, leads, etc. Device template 1610 is a virtual representation of semiconductor device 104, or a type of semiconductor device 104. For example, the package type, the number of leads, thickness, length and width, and other salient characteristics of semiconductor device 104 may be represented by device template 1610 suitably. In some embodiments, separate templates may be generated to represent tray 106 with semiconductor device 104 therein, and tray 106 without semiconductor device 104 therein. In the illustration, template 1610 is shows as filling completely the receptacle it is in; however, in some cases, semiconductor device 104 may be smaller than its respective receptacle and may only partially fill the space thereof. As a consequence, the center point representing the receptacle may not coincide with the center point of semiconductor device 104 in a physical embodiment. Nevertheless, the center point of a particular receptacle may be closer to the center point of semiconductor device 104 therein than to the center points of other semiconductor devices 104 in adjacent receptacles.

Each center point of semiconductor device 104 may represent one of active positions 152 or 154. In some embodiments, active positions 152 and 154 may be in separate zones 1602 in common tray template 1600; for example, active position 152 may be in zone 1602A and active position 154 may be in zone 1602B. In some other embodiments, active positions 152 and 154 may be in the same zone 1602. In yet other embodiments, active position 152 and 154 may be the same (i.e., semiconductor device 104 is returned to the same receptacle after testing). In some embodiments, there may be only a single zone 1602 (i.e., the entire tray may be represented as single zone 1602).

In some embodiments, during operation, vision head 1202 may be used to initialize the actual tray position, for example, by identifying two salient locations, such as top right corner 1604 and bottom left corner 1606 of tray 106. Having identified these two salient points, tray template 1600 may be positioned between them so as to represent the actual position of tray 106 virtually in controller 1500. Any active position 152 (i.e., center of semiconductor device 104 of interest) may be approximately represented by the closest center point of the corresponding receptacle as identified by a specific row and specific column.

Mapping of tray 106 to tray template 1600 may be a manual process in some embodiments, with the mapping operations performed when handler 102 is deployed in system 100 or configured at the factory before any engineering or production run. In some embodiments, mapping may be performed automatically by image processing algorithms. For example, tray 106 may be placed in tray recess 142 and vision head 1202 positioned over tray 106. Camera 1204 may take a photo of tray 106 and identify the length, width, corners, etc. as needed to generate tray template 1600. Suitable image processing algorithms may be executed to identify various edges and boundaries, for example, to determine the various center points of each receptacle in a waffle type tray. In some embodiments, the image may be cropped suitably to generate tray template 1600. The same image may be used to generate device template 1610 in cases where tray 106 has one or more semiconductor device 104 placed therein. Multiple images may be taken of tray 106 and a subset of them used to validate against another subset, for example, in a train/test mode.

One or more tray templates 1600 may represent the same type of tray 106, for example, to account for variations in dimensions between different samples of tray 106. Likewise, one or more device templates 1610 may represent the same type of semiconductor device 104, for example, to account for variations in dimensions between different samples of semiconductor device 104. Each such tray template 1600 and device template 1610 may be stored in system 100, for example, in controller 1500.

Figure 17:
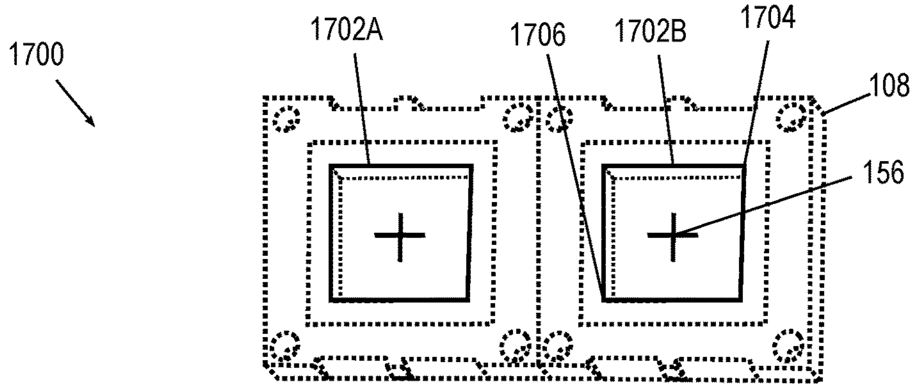
FIG. 17 is a simplified view of an example socket template in an example system for handling semiconductor devices during testing.

FIG. 17 is a simplified top view of a socket template 1700 representative of socket 108 according to an example embodiment. Socket template 1700 is a virtual representation of socket 108, or a type of socket 108. Note that socket 108 shown and illustrated is merely as an example of a receptacle for semiconductor device 104 and is not to be construed as a limitation. Any suitable receptacle for semiconductor device 104 may be mapped to socket template 1700 in system 100 without departing from the scope of the various embodiments. In the example shown, socket 108 is a double sited socket configured to receive two semiconductor devices 104. According to various embodiments, controller 1500 may map socket 108 into socket template 1700 as one or more sites 1702, for example, 1702A and 1702B corresponding to the sites in socket 108. Each site 1702 may be identified by its boundaries (shown in continuous line) and as having a center point (shown as a cross). The boundaries and center point may provide the geometry and alignment information needed to accurately identify active position 156. In some embodiments, during operation, vision head 1202 may be used to initialize the actual socket position, for example, by identifying two salient locations, such as top right corner 1704 and bottom left corner 1706 of the receptacle in socket 108. Having identified these two salient points, socket template 1700 may be positioned between them so as to represent the actual position of socket 108 in system 100.

Mapping of socket 108 to socket template 1700 may be a manual process in some embodiments, with the mapping operations performed when handler 102 is deployed in system 100 or configured at the factory before any engineering or production run. One or more socket template 1700 may represent the same type of socket 108, for example, to account for variations in dimensions between different samples of socket 108. Each such socket template 1700 may be stored in system 100, for example, in controller 1500.

Figure 18:
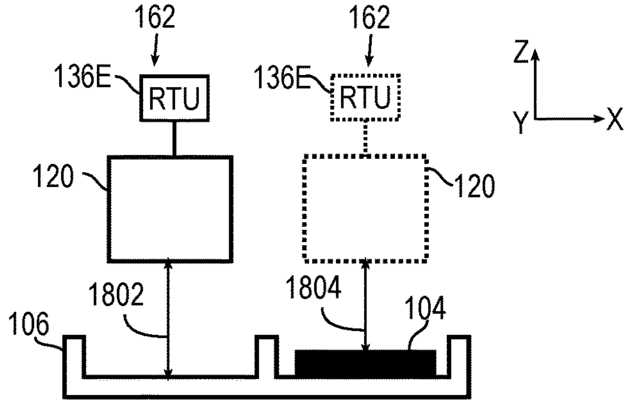
FIG. 18 is a simplified schematic diagram for illustrating some example operations of a vision head in an example system for handling semiconductor devices during testing.

FIG. 18 is a simplified block diagram illustrating example operations to generate tray template 1600, device template 1610, and/or socket template 1700 according to an example embodiment. PNP head 120 may be positioned above tray 106 (or socket 108). Initially, vision head 1202 may verify placement of tray 106 (or socket 108), after which PNP nozzle head 122 may be moved thereto. PNP nozzle head 122 may be moved down by depth 1802 until PNP nozzle 1006 touches bottom of tray 106 (or socket 108) and another depth 1804 until PNP nozzle 1006 touches top of semiconductor device 104. Depths 1802 and 1804 may be converted to rotations of relevant actuators 140E that controls the Z-motion of PNP nozzle head 122. Depths 1802 and 1804 may be stored suitably as part of tray template 1600, device template 1610, and socket template 1700, for example, in controller 1500 of control system 162.

In many embodiments, depths 1802 and 1804 may be determined during setup of handler 102 to prevent PNP nozzle 1006 from moving too much along the Z-axis and hitting the bottom of tray 106 (or socket 108) or the top of semiconductor device 104. In some embodiments, PNP nozzle 1006 may not touch the surfaces of tray 106 (or socket 108) or semiconductor device 104 but may be brought close enough that vacuum suction is sufficient to pick up semiconductor device 104 from tray 106 (or socket 108). During operation, the distance traversed by PNP nozzle head 122 along the Z-axis may be determined in reference to depths 1802 and 1804.

Figure 19A:
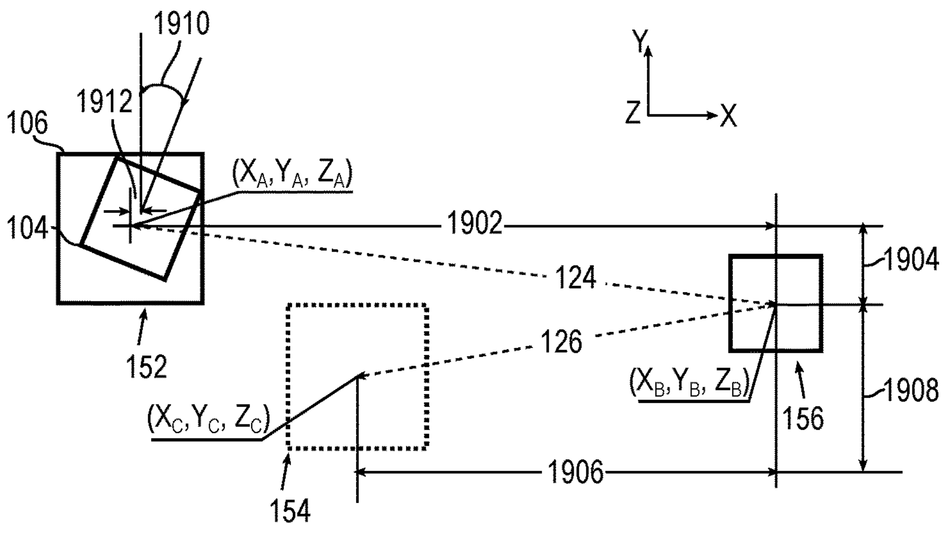
FIGS. 19A and 19B are simplified schematic diagrams for illustrating other example operations of a vision head in an example system for handling semiconductor devices during testing.
Figure 19B:
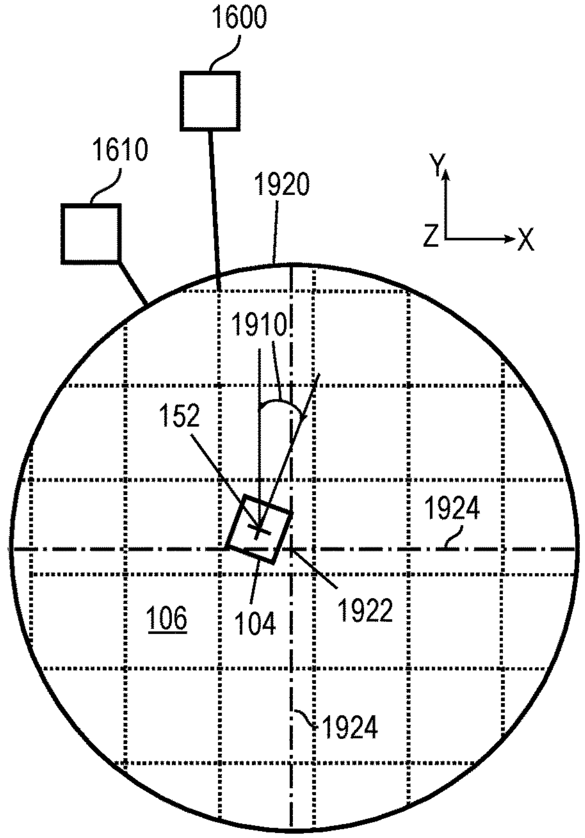

FIGS. 19A and 19B are simplified schematic diagrams illustrating example operations to identify semiconductor device 104 in tray 106 and determine paths 124 and 126 of PNP subsystem 118 using vision head 1202. As shown in FIG. 19A, in various embodiments, vision head 1202 may identify active position 152, for example, as X, Y, Z co-ordinates ($X_a$, $Y_a$, $Z_a$) in the X-Y-Z orthogonal space. In some embodiments, ($X_a$, $Y_a$, $Z_a$) may represent the respective travel along the X-axis of PNP head 120, along the Y-axis of PNP carriage 220, and along the Z-axis of PNP nozzle head 122 from their respective base configuration and PNP home position 150. ($X_a$, $Y_a$, $Z_a$) may be stored as part of tray template 1600 in some embodiments, for example, in controller 1500.

In various embodiments, vision head 1202 may traverse PNP path 124 to reach active position 156, and identify active position 156 by X, Y, Z co-ordinates ($X_b$, $Y_b$, $Z_b$) in the X-Y-Z orthogonal space. In some embodiments, ($X_b$, $Y_b$, $Z_b$) may represent the respective travel along the X-axis of PNP head 120, along the Y-axis of PNP carriage 220, and along the Z-axis of PNP nozzle head 122 from their respective base configuration and PNP home position 150. X-travel 1902 between active positions 152 and 156 may be calculated as $X_b-X_a$; Y-travel 1904 between active positions 152 and 156 may be calculated as $Y_b$-$Y_a$; and Z-travel (not labeled) between active positions 152 and 156 may be calculated as $Z_b$-$Z_a$. ($X_b$, $Y_b$, $Z_b$) and/or the various other distances may be stored as part of tray template 1600 in some embodiments, for example, in controller 1500.

In various embodiments, vision head 1202 may traverse PNP path 126 from active position 156 to reach active position 154, and identify active position 156 by X, Y, Z co-ordinates ($X_c$, $Y_c$, $Z_c$) in the X-Y-Z orthogonal space. In some embodiments, ($X_c$, $Y_c$, $Z_c$) may represent the respective travel along the X-axis of PNP head 120, along the Y-axis of PNP carriage 220, and along the Z-axis of PNP nozzle head 122 from their respective base configuration and PNP home position 150. X-travel 1906 between active positions 156 and 154 may be calculated as $X_c-X_b$; Y-travel 1908 between active positions 156 and 154 may be calculated as $Y_c-Y_b$; and Z-travel (not labeled) between active positions 156 and 154 may be calculated as $Z_c-Z_b$. ($X_c$, Y, $Z_c$) and/or the various other distances may be stored as part of tray template 1600 in some embodiments, for example, in controller 1500.

During operation, vision head 1202 may identify misalignment of semiconductor device 104 in tray 106. Misalignment may include angular misalignment 1910 by which semiconductor device 104 is rotated in tray 106. Misalignment may also include linear misalignment 1912 along X-axis and/or Y-axis from the center of the respective receptacle in tray 106. Misalignments, including angular misalignment 1910 and linear misalignment 1912 may be detected by vision head 1202 as described in FIG. 19B and using suitable edge detection algorithms beyond the scope of the present disclosure. PNP nozzle head 122 may be adjusted suitably to remove the misalignment, for example, PNP nozzle head 122 may be moved along the X-axis or Y-axis, as the case may be, to center on semiconductor device 104 before semiconductor device 104 is picked up and rotated by an to offset angular misalignment 1910 after semiconductor device 104 is picked up.

FIG. 19B is a simplified diagram schematically illustrating a top view of a field of view 1920 of camera 1204. Center 1922 of field of view 1920 is where crosshairs 1924 of camera 1204 intersect. During operation, vision head 1202 may be moved so that center 1922 is approximately close to active position 152, corresponding to the center of semiconductor device 104. The exact location of semiconductor device 104 may not be known apriori, because semiconductor device 104 may have moved inside its receptacle in tray 106 by the time tray 106 is loaded into handler 102. In many situations, semiconductor device 104 is much smaller than the receptacle of tray 106 that holds it, and semiconductor device 104 in any one receptacle may not be in the exact same location or orientation as any other semiconductor device 104 in other receptacles in tray 106. Thus, at the outset, only the approximate location of active position 152 may be known as being somewhere in the vicinity of the center of the receptacle of tray 106 holding semiconductor device 104.

The center of the receptacle of tray 106 may be initially identified by its (row, column) co-ordinates in tray template 1600. Center 1922 of camera 1204 may be moved approximately close to, but need not be exactly at, the center of the receptacle which holds semiconductor device 104 to be picked up; further, center 1922 may be approximately close to, but need not be exactly aligned with, center of actual semiconductor device 104. After vision head 1202 comes to a halt in the vicinity of active position 152 over the specific receptacle of interest, camera 1204 captures an image of field of view 1920. The captured image is compared with device template 1610 corresponding to semiconductor device 104. The comparison may be performed using any suitable image processing algorithm beyond the scope of the present disclosure. In the image, a shape having closest match with device template 1610 and closest to center 1922 may be identified as semiconductor device 104 to be picked up. Comparison with device template 1610 may also enable identifying any angular misalignment 1910 and linear misalignment 1912.

Use of camera 1204 for identifying semiconductor device 104, including its misalignment, in tray 106 enables operations without using a precisor. As described previously, the precisor is a gravity fed precisely machined receptacle that can hold semiconductor device 104 in a predetermined orientation. In systems that do not use vision head 1202 to identify semiconductor device 104, the nozzle may approach a location approximately close to semiconductor device 104, not necessarily at its center, and then picks it up. Such pick-up operation may result in semiconductor device 104 being picked up off-center, for example, by its corner. In such systems, the next operation is to drop semiconductor device 104 in the precisor. The precisor reorients semiconductor device 104 to a predetermined orientation by force of gravity. Thereafter, the location and orientation of semiconductor device 104 is precisely known and the nozzle can again pick up semiconductor device 104 from the precisor without additional alignment operations. However, the precisor is not only cumbersome to add to the equipment, but it also increases the overall cost due to its precise manufacturing requirements and it adds additional steps to the pick-and-place operations. Further, a separate precisor is needed for every different type of semiconductor device 104 to be tested. Embodiments of system 100, on the other hand, use vision head 1202, including camera 1204 along with prestored templates 1600 and 1610 to identify semiconductor device 104 precisely avoiding the use of any precisor.

Figure 20:
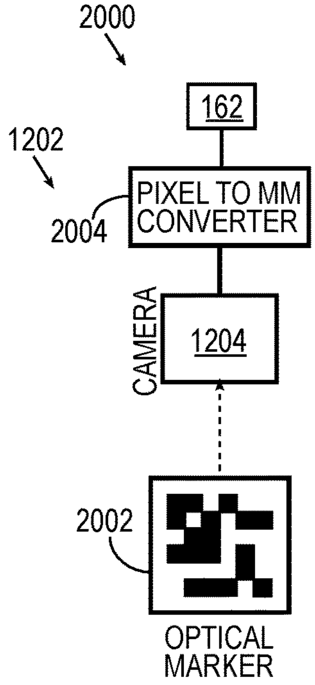
FIG. 20 is a simplified block diagram illustrating example configuration operations that may be associated with embodiments of an example system for handling semiconductor devices during testing.

FIG. 20 is a simplified block diagram illustration calibration operations 2000 associated with converting pixel information of camera 1204 to distance information (e.g., in millimeters) according to an example embodiment. A calibrated optical marker 2002 may be placed under camera 1204. Calibrated optical marker 2002 may have precisely measured optical shapes. Camera 1204 may take an image of optical marker 2002. The precisely measured optical shapes may be correlated with the pixel information of the image captured by camera 1204 by pixel to mm converter 2004. In other words, pixel to mm converter 2004 converts pixels in the captured image to linear dimensions (e.g., in mm). The conversion information may be stored suitably, for example, in controller 1500.

Figure 21:
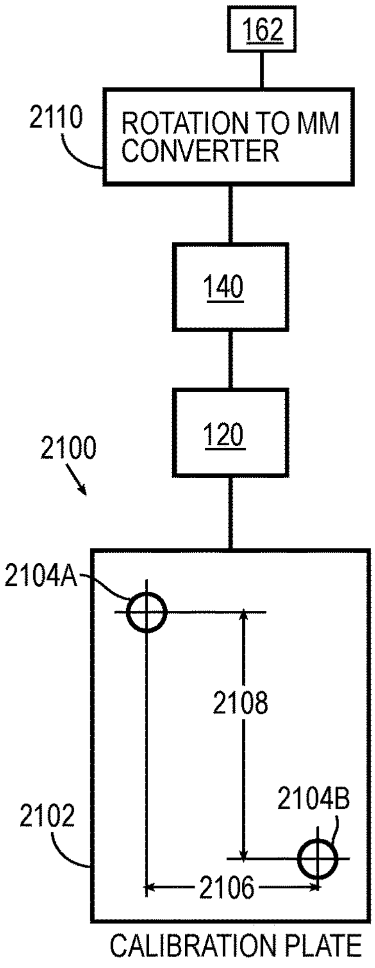
FIG. 21 is a simplified block diagram illustrating other example configuration operations that may be associated with embodiments of an example system for handling semiconductor devices during testing.

FIG. 21 is a simplified block diagram illustration calibration operations 2100 associated with converting rotation information of actuators 140 to distance information (e.g., in millimeters) according to an example embodiment. A calibration plate 2102 may be placed under PNP head 120. Calibration plate 2102 may have markers at precisely measured locations 2104A and 2104B. In various embodiments, location 2104A may be suitably identified by camera 1204 by moving PNP head 120 such that camera 1204 is directly over location 2104A. Thereafter, PNP nozzle head 122 may be moved to location 2104A. The distance traveled by PNP nozzle head 122 to reach the same location as camera 1204 represents offset 1208. Thereafter, PNP head 120 may be moved to location 2104B and the distances traveled 2106 and 2108 along the X-axis and the Y-axis respectively by PNP nozzle head 122 between locations 2104A and 2104B may be corresponded with the rotations of respective actuators 140 (e.g., 140A, 140B) by rotation to mm converter 2110. In other words, rotation to mm converter 2110 converts rotations of the actuator to linear dimensions (e.g., distance traveled in mm). The conversion information may be stored suitably, for example, in controller 1500.

Figure 22:
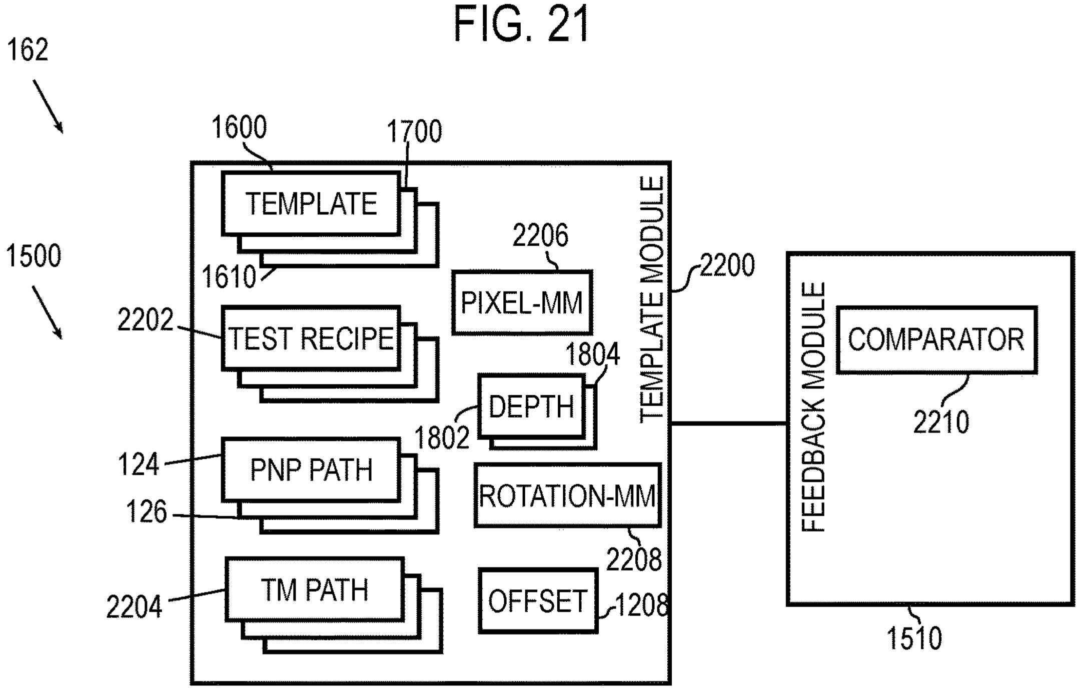
FIG. 22 is a simplified block diagram illustrating example details of an example system for handling semiconductor devices during testing.

FIG. 22 is a simplified block diagram illustrating example details of a template module 2200 of controller 1500 in control system 162 according to an example embodiment. In some embodiments, template module 2200 may be provisioned in feedback module 1510. In other embodiments, template module 2200 may be stored in memory 1506 suitably and accessed by other modules, for example feedback module 1510. In yet other embodiments, template module 2200 may be distributed across various components of control system 162.

Template module 2200 may comprise various templates 1600, 1610, and 1700; paths 124, 126, depths 1802, 1804, offset 1208, test recipes 2202, TM paths 2204, pixel-mm conversions 2206, and rotation-mm conversions 2208 from various calibration and setup operations. Each tray template 1600, device template 1610 and socket template 1700 may include a plurality of corresponding templates of tray 106, semiconductor device 104, and socket 108, respectively. Likewise, each PNP path 124 may correspond to different paths between various ones of active positions 152, for example, corresponding to the different centers of a waffle tray configured to receive a plurality of semiconductor device 104 and different sites on socket 108. Likewise, each PNP path 126 may correspond to different paths between various ones of active positions 154, for example, corresponding to the different centers of a waffle tray configured to receive a plurality of semiconductor device 104 and different sites on socket 108.

Test recipe 2202 may include various test settings commonly used for testing. Test recipe 2202 may include, as examples and not as limitations, temperature settings and soak times. In some embodiments, a few such test recipes 2202 may be stored during configuration of handler 102 and others may be manually input by an operator prior to testing. In some other embodiments, all test recipes 2202 may be manually input by an operator prior to testing. In yet other embodiments, tester 160 may provide test recipe 2202 to handler 102 prior to testing. Each TM path 2204 may correspond to different paths between various ones of active positions 156, for example, corresponding to the different sites on socket 108, and TM home position 158 of TM subsystem 128. Pixel-mm conversions 2206 may include information for different ones of camera 1204 preconfigured in handler 102. Rotation-mm conversions 2208 may include information for each of actuators 140A-140F.

Feedback module 1510 may be provisioned with a comparator 2210. Comparator 2210 may use information from template module 2200 to compute and identify various elements such as dimensions, positions, distances, boundaries, etc. For example, comparator 2210 may compare images captured by camera 1204 with tray template 1600, and device template 1610 in template module 2200 to identify the center of semiconductor device 104 in tray 106, and angular misalignment 1910 and linear misalignment 1912 of semiconductor device 104. The comparison may be performed using any suitable image processing algorithms beyond the scope of the present disclosure. Other functions of comparator 2210 include template matching, distance computation, path identification, rotation angles, actuator turns, etc.

Figure 23:
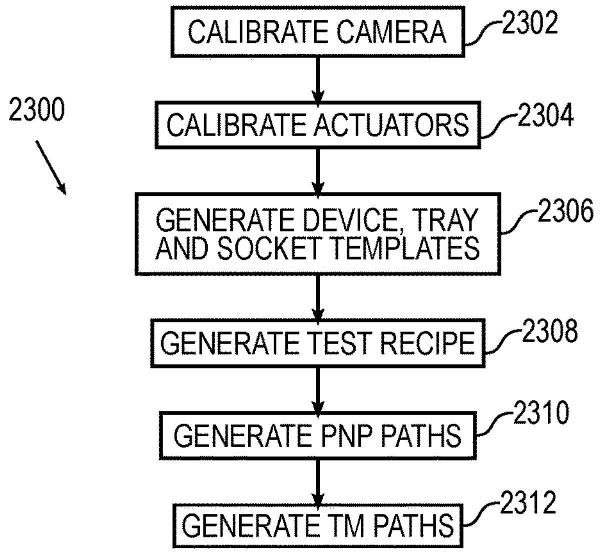
FIG. 23 is a simplified flow diagram illustrating example operations associated with an example system for handling semiconductor devices during testing.

FIG. 23 is a simplified flow diagram illustrating example configuration operations 2300 that may be associated with some embodiments of system 100. At 2302, camera 1204 may be calibrated suitably as described in reference to FIG. 20, and the pixel-mm conversions 2206 may be stored suitably in system 100. At 2304, actuators 140 may be calibrated suitably as described in reference to FIG. 21, and the rotation-mm conversions 2208 may be stored suitably in system 100. At 2306, one or more of tray template 1600, device template 1610, and socket template 1700 may be suitably generated as described in reference to FIGS. 16, 17 and 18, and stored appropriately. At 2308, the test recipe for testing semiconductor device 104 may be generated, for example, by entering the temperature and soak times for testing. At 2310, PNP paths 124 and 126 may be generated, for example, as described in reference to FIG. 19A, and stored appropriately. At 2312, TM paths 2204 may be generated substantially similarly to generating PNP paths 124 and 126, except using TM subsystem 128 and actuators 140 thereof. Generated TM paths 2204 may be stored suitably in system 100.

Figure 24:
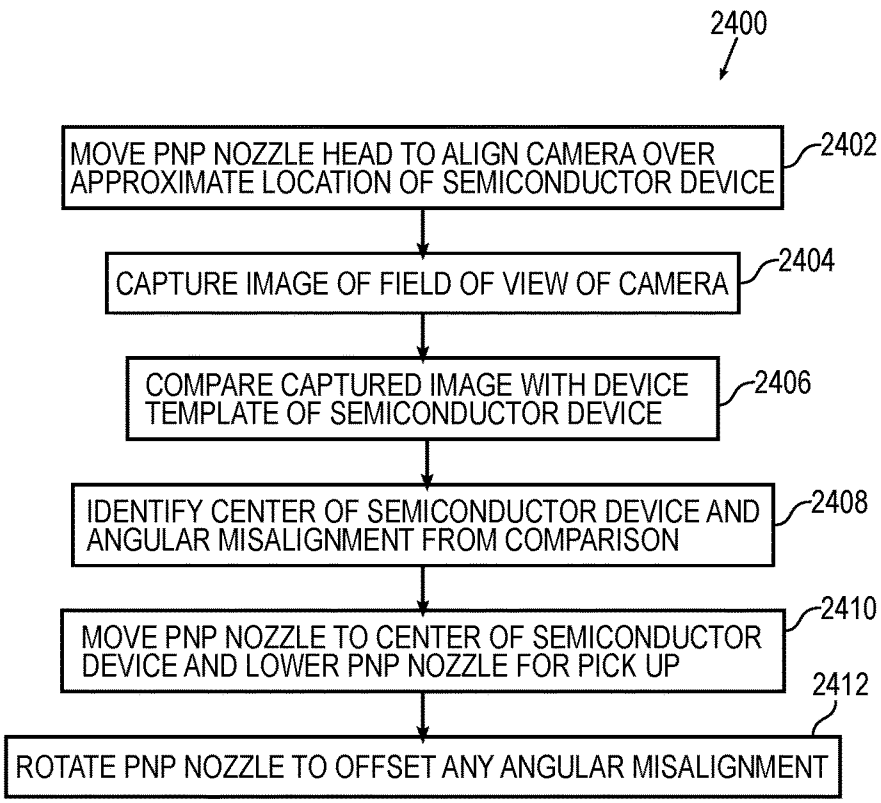
FIG. 24 is a simplified flow diagram illustrating other example operations associated with an example system for handling semiconductor devices during testing.

FIG. 24 is a simplified flow diagram illustrating example pickup operations 2400 that may be associated with some embodiments of system 100. At 2402, PNP nozzle head 122 may be moved to align camera 1204 over approximate location of semiconductor device 104. At 2404, an image of field of view 1920 may be captured by vision head 1202. At 2406, the captured image may be compared with stored template(s) 1610 of semiconductor device 104. The center of semiconductor device 104 and any angular misalignment 1910 may be identified from the comparison at 2408. At 2410, PNP nozzle head 122 may be moved to align PNP nozzle 1006 with the center of semiconductor device 104 (e.g., moved by linear misalignment 1912 and offset 1208 between camera 1204 and PNP nozzle 1006). PNP nozzle head 122 may be lowered along the Z-axis until PNP nozzle 1006 is almost touching (or touching) the surface of semiconductor device 104. Vacuum may be activated to pick up semiconductor device 104. At 2412, PNP nozzle 1006 may be rotated to offset any angular misalignment 1910.

Figure 25:
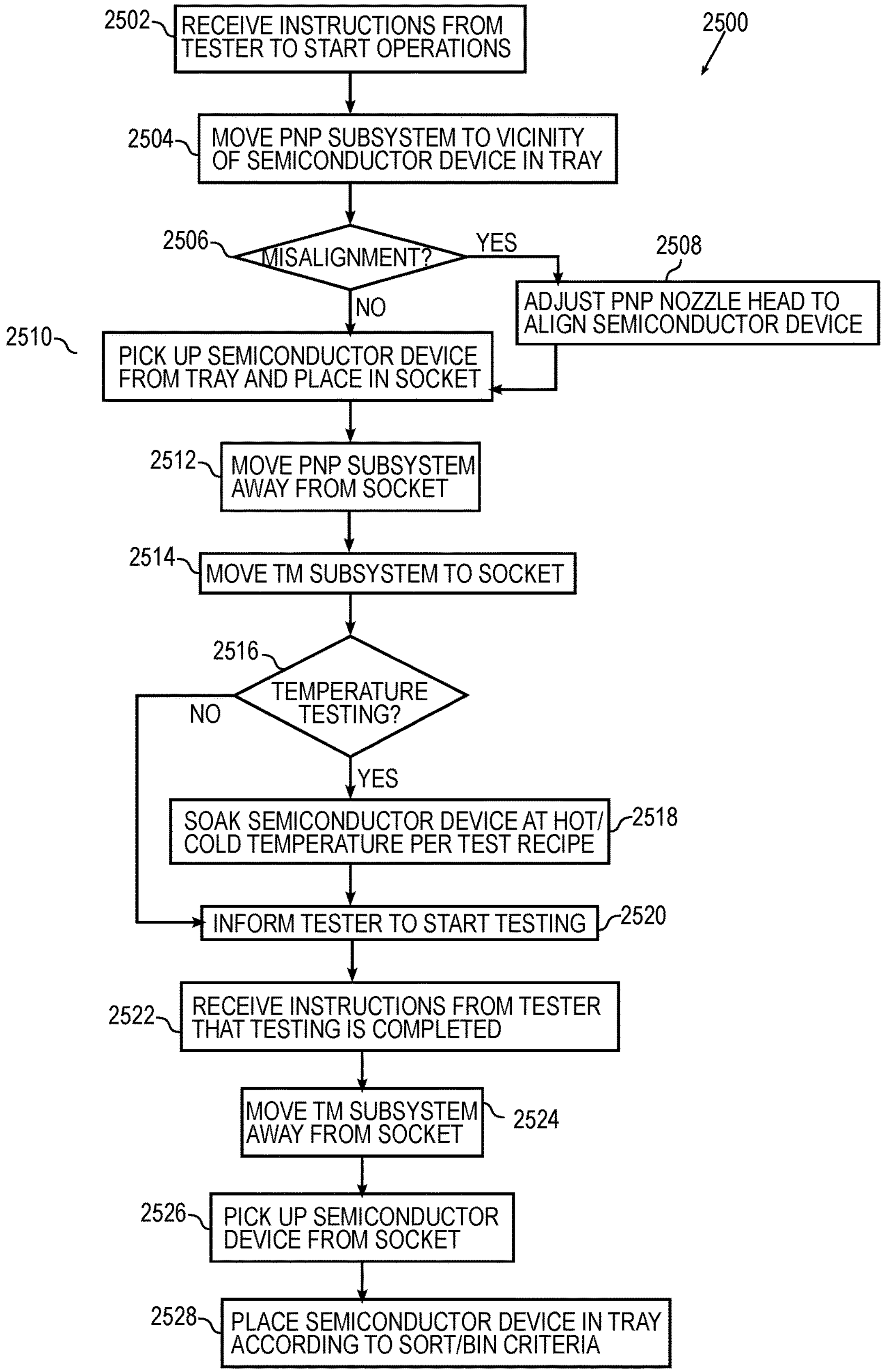
FIG. 25 is a simplified flow diagram illustrating yet other example operations associated with an example system for handling semiconductor devices during testing.

FIG. 25 is a simplified flow diagram illustrating example handling operations 2500 that may be associated with some embodiments of system 100. At 2502, handler 102 may receive instructions from tester 160 to start operations. At 2504, PNP subsystem 118 may be moved appropriately to the vicinity of semiconductor device 104 in tray 106. At 2506, a determination may be made whether there is misalignment of semiconductor device 104 with respect to socket 108. If misalignment is detected, at 2508, PNP nozzle head 122 may be adjusted by appropriate movements to offset any angular misalignment 1910 and linear misalignment 1912 to align semiconductor device 104 suitably. At 2510, semiconductor device 104 may be picked up from tray 106 and placed in socket 108. At 2512, PNP subsystem 118 is moved away from socket 108. At 2514, TM subsystem 128 is moved to vicinity of socket 108. At 2516, a determination may be made whether temperature testing is to be conducted. In some embodiments, the determination comprises looking up appropriate test recipe 2202. If temperature testing is to be conducted, at 2518, semiconductor device 104 is soaked at the specified temperature (e.g., hot or cold) per test recipe 2202. If no temperature testing is to be performed, the operations may step from 2516 to 2520 directly. At 2520, tester 160 may be informed that semiconductor device 104 is ready and testing may commence. At 2522, tester 160 may complete testing and handler 102 may receive instructions from tester 160 that testing is completed. At 2524, TM subsystem 128 is moved away from socket 108. At 2526, semiconductor device 104 is picked up from socket 108 by PNP subsystem 118. At 2528, semiconductor device 104 is placed in tray 106 according to the sort/bin criteria provided by tester 160.

Although the present disclosure has been described in detail with reference to particular arrangements and configurations, these example configurations and arrangements may be changed significantly without departing from the scope of the present disclosure. For example, although the present disclosure has been described with reference to particular types of components, handler 102 may be implemented using other components that perform substantially the same functions in similar ways. For example, servo motors 206 may be replaced with stepper motors and vice versa; rails may be replaced with wheels and grooves; etc. Moreover, although system 100 has been illustrated with reference to particular elements and operations that facilitate various control system process, these elements, and operations may be replaced by any suitable architecture or process that achieves the intended functionality of system 100.

In various embodiments, the operations described in FIGS. 19-25 are performed automatically without human intervention. Although FIGS. 19-25 illustrate various operations performed in a particular order, this is simply illustrative, and the operations discussed herein may be reordered and/or repeated as suitable. Further, additional operations which are not illustrated may also be performed without departing from the scope of the present disclosure. Also, various ones of the operations discussed herein with respect to FIGS. 19-25 may be modified in accordance with the present disclosure to facilitate operations of handler 102 in system 100 as disclosed herein. Although various operations are illustrated in FIGS. 23-25 once each, the operations may be repeated as often as desired.

It is important to note that the operations described with reference to the preceding figures illustrate only some of the possible scenarios that may be executed by, or within, system 100. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion.

Select Examples

Example 1 provides a system, comprising: a first plate in a plane of an X-axis and a Y-axis, the X-axis and the Y-axis being mutually orthogonal; a second plate parallel to and offset from the first plate along a Z-axis, the Z-axis being mutually orthogonal to the X-axis and the Y-axis; a first subsystem slidably coupled to the first plate, the first subsystem comprising a pick-and-place (PNP) carriage to slide along the Y-axis, the PNP carriage comprising a PNP head to slide along the X-axis, the PNP head comprising a PNP nozzle head to slide along the Z-axis; and a second subsystem slidably coupled to the second plate, the second subsystem comprising a thermo-mechanical (TM) carriage to slide along the X-axis and a TM head slidably coupled to the carriage to slide along the Z-axis, wherein: the PNP nozzle head includes a PNP nozzle to pick a semiconductor device from a first location and place the semiconductor device at a second location on a printed circuit board, and the TM head is to facilitate exertion of a predetermined pressure on the semiconductor device at the second location.

Example 2 provides the system of example 1, wherein the first plate comprises: at least one recess for a tray configured for placing semiconductor devices; and an opening for the printed circuit board.

Example 3 provides the system of example 2, wherein the tray is a matrix tray having dimensions approximately according to JEDEC standards.

Example 4 provides the system of any of examples 1-3, wherein: the printed circuit board has a first side and an opposing second side, the first side is exposed to the PNP head and the TM head, and the second side is exposed to a tester.

Example 5 provides the system of any of examples 1-4, further comprising: separate sets of rails affixed to the first plate to facilitate sliding of the first subsystem along the X-axis and the Y-axis; and another set of rails affixed to the second plate to facilitate sliding of the second subsystem along the X-axis.

Example 6 provides the system of any of examples 1-5, wherein: the first subsystem is to slide between a home position and a plurality of active positions, and the plurality of active positions of the first subsystem comprises at least: a first active position proximate to the first location; a second active position proximate to the second location; and a third active position proximate to a third location.

Example 7 provides the system of example 6, wherein: the first location is proximate to a first zone in a tray, the second location is proximate to a socket in the printed circuit board, and the third location is proximate to a second zone in the tray or another tray.

Example 8 provides the system of example 7, wherein: the socket comprises a plurality of sites for a corresponding plurality of semiconductor dies, and the second location is one of the plurality of sites.

Example 9 provides the system of any of examples 6-8, wherein: the PNP head further comprises a vision head at a fixed offset from the PNP nozzle head, and the vision head is to identify the plurality of active positions of the first subsystem.

Example 10 provides the system of example 9, wherein the vision head comprises an optical camera.

Example 11 provides the system of any of examples 1-10, wherein the second subsystem is to slide between a home position and an active position.

Example 12 provides the system of example 11, wherein the home position and the active position are identified by a proximity sensor.

Example 13 provides the system of any of examples 11-12, wherein the active position of the second subsystem is proximate to the second location.

Example 14 provides the system of any of examples 11-13, wherein the second subsystem is at the home position when the first subsystem is at the second location.

Example 15 provides the system of any of examples 1-14, wherein a top of the first subsystem is between the second plate and the first plate along the Z-axis.

Example 16 provides the system of any of examples 1-15, wherein the first subsystem and the second subsystem are not simultaneously at the second location during operation of the system.

Example 17 provides the system of any of examples 1-16, wherein the TM carriage comprises: a TM carriage first plate including a plurality of sliders to facilitate sliding on rails, the rails being attached to the second plate of the system; and a TM carriage second plate parallel to and coupled at a fixed offset from the TM carriage first plate along the Z-axis.

Example 18 provides the system of example 17, wherein the TM head comprises: a TM head first plate between the TM carriage first plate and the TM carriage second plate; a TM head second plate parallel to and coupled at a fixed offset from the TM first plate, the TM head second plate positioned between the TM carriage second plate and the first plate of the system, the TM head second plate having a first side proximate to the TM head first plate and an opposing second side proximate to the first plate of the system; and a casing coupled by spring-loaded fasteners to the second side of the TM head second plate, wherein: the TM head first plate is to slide along the Z-axis, the casing is to envelope the semiconductor device on the printed circuit board, and the spring-loaded fasteners are to enable the casing to maintain contact on the printed circuit board.

Example 19 provides the system of example 18, wherein the second subsystem further includes a fixture removably coupled to the TM head second plate by spring-loaded fasteners, wherein the fixture is to exert the predetermined pressure on the semiconductor device.

Example 20 provides the system of any of examples 1-19, wherein the predetermined pressure is sufficient to enable electrical connectivity between the semiconductor device and the printed circuit board.

Example 21 provides the system of any of examples 1-18 or 20, wherein: the TM head is further to facilitate heat transfer to the semiconductor device at the second location, the second subsystem further comprises a fixture to facilitate the heat transfer, the fixture is to further exert the predetermined pressure on the semiconductor device, and the fixture is mounted to the TM head by spring-loaded fasteners.

Example 22 provides the system of any of examples 1-21, further comprising a pair of third plates in a plane of the Z-axis and the X-axis, the third plates directly coupled to the first plate and the second plate.

Example 23 provides the system of any of examples 1-22, further comprising: a first actuator to slide the PNP carriage along the Y-axis; a second actuator to slide the PNP head along the X-axis; a third actuator to slide the PNP nozzle head along the Z-axis; a fourth actuator to rotate the PNP nozzle around the Z-axis; a fifth actuator to slide the TM carriage along the X-axis; and a sixth actuator to slide the TM head along the Z-axis.

Example 24 provides the system of example 23, wherein: the first actuator comprises a first servo motor coupled with a Y-axis lead screw fixed to the first plate, the second actuator comprises a second servo motor coupled with an X-axis lead screw fixed to the PNP carriage, the third actuator comprises a stepper motor coupled with a Z-axis lead screw fixed to PNP head, the fourth actuator comprises a theta-motor mounted to the PNP nozzle head, the fifth actuator comprises a third servo motor coupled with another X-axis lead screw fixed to the second plate, and the sixth actuator comprise a fourth servo motor coupled with another Z-axis lead screw fixed to the TM carriage.

Example 25 provides the system of example 24, wherein each of the first actuator, the second actuator, the third actuator, the fourth actuator, the fifth actuator and the sixth actuator is separately controlled by a corresponding remote terminal unit.

Example 26 provides the system of example 25, wherein: the remote terminal units are controlled by a central controller, and the remote terminal units are coupled together in a daisy chain to the central controller.

Example 27 provides the system of example 26, wherein: the daisy chain comprises a plurality of daisy chains, the daisy chains in the plurality of daisy chains are independently and separately coupled with the central controller, and different subsets of the remote terminal units are coupled together to different ones in the plurality of daisy chains.

Example 28 provides the system of any of examples 1-27, further comprising a housing enclosing the first plate, the second plate, the first subsystem and the second subsystem.

Example 29 provides the system of example 28, wherein the housing is configured to dock with a tester on which the printed circuit board is mounted.

Example 30 provides the system of any of examples 28-29, wherein the housing facilitates coupling the printed circuit board to the first plate.

Example 31 provides an apparatus, comprising: a frame having a bottom plate and a top plate in a three-dimensional space of mutually orthogonal X-axis, Y-axis and Z-axis, the top plate offset from the bottom plate along the Z-axis; a thermo-mechanical (TM) subsystem slidably coupled to the top plate, the TM subsystem comprising: a TM carriage to slide along the X-axis; and a TM head to slide on the carriage along the Z-axis, the TM head configured to position a fixture to exert pressure on a semiconductor device in a socket of a printed circuit board; and a pick-and-place (PNP) subsystem slidably coupled to the bottom plate, the PNP subsystem comprising: a PNP carriage to slide along the Y-axis; a PNP head to slide on the PNP carriage along the X-axis; and a PNP nozzle head to slide on the PNP head along the Z-axis, the PNP nozzle head comprising: a PNP nozzle to rotate around the Z-axis and to removably couple to the semiconductor device; and a vision head to recognize the semiconductor device from surroundings of the semiconductor device.

Example 32 provides the apparatus of example 31, wherein the PNP head comprises: a hollow shaft coupled to the PNP nozzle, the hollow shaft to provide vacuum at the PNP nozzle, the hollow shaft coupled to an elbow coupler; and a support plate having a cutout in which the elbow coupler is positioned.

Example 33 provides the apparatus of any of examples 31-32, wherein: the PNP head comprises a PNP base plate slidably mounted on rails fixed to the PNP carriage, and the PNP nozzle head slides along the Z-axis on rails fixed to the PNP base plate.

Example 34 provides the apparatus of any of examples 31-33, wherein the TM head slides along the Z-axis on pillars fixed to the TM carriage.

Example 35 provides the apparatus of any of examples 31-34, wherein: the TM carriage slides along the X-axis on rails fixed to the top plate, and the PNP carriage slides along the Y-axis on rails fixed to the bottom plate.

Example 36 provides the apparatus of any of examples 31-35, wherein the fixture is further to heat or cool the semiconductor device in the socket.

Example 37 provides the apparatus of any of examples 31-36, wherein: the apparatus is electrically coupled to a control system to control movements of the PNP carriage, the PNP head, the PNP nozzle head, the TM carriage, and the TM head, and the control system comprises: a plurality of actuators to control movements of the PNP carriage, the PNP head, the PNP nozzle head, the TM carriage, and the TM head separately, a plurality of remote terminal units (RTUs) controlling corresponding ones in the plurality of actuators; and a controller communicable with the plurality of RTUs on a MODBUS interface.

Example 38 provides the apparatus of example 37, wherein the plurality of RTUs is electrically coupled to the controlled in a daisy chain.

Example 39 provides the apparatus of any of examples 37-38, wherein the plurality of actuators comprises: a first actuator to control sliding of the PNP carriage along the Y-axis; a second actuator to control sliding of the PNP head on the PNP carriage along the X-axis; a third actuator to control sliding of the TM carriage on the top plate along the X-axis; a fourth actuator to control sliding of the TM head on the TM carriage along the Z-axis; a fifth actuator to control sliding of the PNP nozzle head on the PNP head along the Z-axis; and a sixth actuator to control rotation of the PNP nozzle head around the Z-axis.

Example 40 provides the apparatus of any of examples 37-39, wherein: the plurality of actuators comprises a first subset, a second subset, and a third subset, each actuator in the first subset comprises a servo motor coupled to a lead screw, the lead screw coupled to a nut that converts rotation of the lead screw to translation along the lead screw, each actuator in the second subset comprises a stepper motor coupled to a lead screw, the lead screw coupled to a nut that converts rotation of the lead screw to translation along the lead screw, and each actuator in the third subset comprises a hollow-shaft theta motor.

Example 41 provides a system, comprising: a handler configured to: (i) pick up a semiconductor device from a tray, (ii) place the semiconductor device in a socket of a printed circuit board, (iii) exert a predetermined pressure on the semiconductor device in the socket, and (iv) return the semiconductor device to the tray; a tester configured to test the semiconductor device in the socket; and a control system configured to: (i) automate operations of the handler, and (ii) coordinate between the handler and the tester, wherein: the handler comprises a pick-and-place (PNP) subsystem and a thermo-mechanical (TM) subsystem, the PNP subsystem and the TM subsystem are to move independent of each other on separate rails, the PNP subsystem is to (i) pick up a semiconductor device from the tray, (ii) place the semiconductor device in the socket, and (iii) return the semiconductor device to the tray, and the TM subsystem is to exert the predetermined pressure on the semiconductor device in the socket.

Example 42 provides the system of example 41, wherein: the PNP subsystem is to move between a PNP home position, a first active position, a second active position and a third active position, the TM subsystem is to move between a TM home position and the third active position, and the PNP home position is different from the TM home position.

Example 43 provides the system of any of examples 41-42, wherein movements of the PNP subsystem and the TM subsystem are controlled by the control system without human intervention.

Example 44 provides the system of any of examples 41-43, wherein the control system controls movements of the PNP subsystem based on information from the tester.

Example 45 provides the system of any of examples 41-44, wherein: the PNP subsystem comprises a vision head to recognize the semiconductor device in the tray, the vision head is further to identify a center and orientation of the semiconductor device, and based on the identifying, the control system enables the PNP subsystem to pick up the semiconductor device from the tray.

Example 46 provides a method executed by a controller in a system for handling a semiconductor device, the method comprising: moving a pick-and-place (PNP) head in the system to an approximate location of the semiconductor device in a tray, the approximate location determined from a tray template stored in the system, the tray template comprising a virtual representation of the tray; automatically capturing an image of the semiconductor device in the tray using a camera in the PNP head; comparing the image to a device template stored in the system, the device template comprising a virtual representation of the semiconductor device; identifying a center of the semiconductor device based on the comparing; and moving a PNP nozzle in the PNP head to the identified center of the semiconductor device.

Example 47 provides the method of example 46, further comprising: identifying an angular misalignment of the semiconductor device in the tray based on the comparing, the angular misalignment relative to a socket of a printed circuit board; and rotating the PNP nozzle to remove the angular misalignment after picking up the semiconductor device from the tray with the PNP nozzle.

Example 48 provides the method of any of examples 46-47, further comprising generating the tray template, wherein: the tray template comprises a plurality of rows and columns, and the approximate location of the semiconductor device is determined by an intersection of a specific row and a specific column in the tray template.

Example 49 provides the method of example 48, wherein generating the tray template further comprises classifying subsets of the rows and the columns into different zones.

Example 50 provides the method of any of examples 46-49, wherein: the center of the semiconductor device at the approximate location represents a first active position of the PNP head, a second active position of the PNP head is at a socket on a printed circuit board, the socket is represented virtually by a socket template stored in the system, with the second active position being represented as a center of the socket template, and the method further comprises picking up the semiconductor device and moving the PNP head with the semiconductor device to the center of the socket template.

Example 51 provides the method of any of examples 46-50, further comprising converting pixels in the captured image to linear dimensions using a calibrated optical marker.

Example 52 provides the method of example 51, wherein the calibrated optical marker comprises shapes having known dimensions.

Example 53 provides the method of any of examples 46-52, wherein: the PNP head moves by action of an actuator in the system, and the method further comprises converting linear distance traveled by the PNP head to rotations of the actuator using a calibration plate.

Example 54 provides the method of example 53, wherein the calibration plate comprises precisely measured locations at known distances from each other.

Example 55 provides the method of any of examples 46-54, wherein the tray template is correlated with the tray using a plurality of reference points on the tray.

Example 56 provides an apparatus, comprising: a pick-and-place (PNP) nozzle coupled to a hollow shaft configured to provide vacuum suction at the PNP nozzle; a camera adjacent to and offset from the PNP nozzle; and a control system to coordinate the PNP nozzle and the camera, the control system including a memory for storing at least one tray template representing a tray for holding semiconductor devices and one device template representing a semiconductor device, wherein the control system, the PNP nozzle and the camera perform operations comprising: moving the PNP nozzle to an approximate location of the semiconductor device in the tray, the approximate location determined in relation to the tray template; capturing an image of the semiconductor device in the tray using the camera; comparing the image to the device template; identifying a center of the semiconductor device based on the comparing; moving the PNP nozzle to the identified center of the semiconductor device; and picking up the semiconductor device using vacuum at the PNP nozzle.

Example 57 provides the apparatus of example 56, wherein the operations further comprise: identifying an angular misalignment of the semiconductor device in the tray based on the comparing, the angular misalignment relative to a socket of a printed circuit board; and rotating the PNP nozzle to remove the angular misalignment after picking up the semiconductor device from the tray with the PNP nozzle.

Example 58 provides the apparatus of any of examples 56-57, wherein the operations further comprise generating the tray template, wherein: the tray template comprises a plurality of rows and columns, and the approximate location of the semiconductor device is determined by an intersection of a specific row and a specific column in the tray template.

Example 59 provides the apparatus of any of examples 56-58, wherein the operations further comprise moving the PNP nozzle with the semiconductor device attached thereto to a socket on a printed circuit board.

Example 60 provides the apparatus of example 59, wherein the operations further comprise moving the PNP nozzle with the semiconductor device attached thereto from the socket to another tray in the apparatus, the another tray represented by another tray template.

Example 61 provides a method executed by a control system coupled to a handler for handling semiconductor devices for testing, the method comprising: moving a pick-and-place (PNP) subsystem in the handler to a vicinity of a semiconductor device in a tray; identifying the semiconductor device in the tray using a camera in the PNP subsystem; picking up the semiconductor device using a PNP nozzle in the PNP subsystem; placing the semiconductor device in a socket of a printed circuit board connected electrically to a tester; moving the PNP subsystem away from the socket; moving a thermo-mechanical (TM) subsystem to the socket; exerting pressure on the semiconductor device by the TM subsystem; informing the tester that the semiconductor device is ready for testing; receiving instructions from the tester that the testing is completed; moving the TM subsystem away from the socket; picking up the semiconductor device from the socket using the PNP nozzle; and placing the semiconductor device in a sorted bin according to the instructions.

Example 62 provides the method of example 61, further comprising: aligning the camera over the semiconductor device in the tray; capturing an image of a field of view of the camera; comparing the image with a device template stored in the control system; identifying a center of the semiconductor device and any misalignment of the semiconductor device from the comparing; and moving the PNP nozzle to the center of the semiconductor device before picking up the semiconductor device.

Example 63 provides the method of any of examples 61-62, further comprising: calibrating the camera, the calibrating comprising generating a correlation of pixels to linear dimensions; calibrating actuators in the handler, the calibrating comprising generating a correlation of motion of the actuator to linear dimensions; generating a tray template, a device template, and a socket template; generating a test recipe; generating a first PNP path from the tray to the socket and another PNP path from the socket to the tray; and generating a TM path from a TM home position to the socket.

Example 64 provides the method of example 63, wherein: the test recipe specifies a temperature and soak time, and the method further comprises soaking the semiconductor device at the temperature for the soak time before informing the tester.

Example 65 provides the method of any of examples 63-64, further comprising: identifying misalignment of the semiconductor device in the tray based on the tray template, the device template and the socket template; and adjusting the PNP nozzle to remove the misalignment.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A system, comprising:
- a first plate in a plane of an X-axis and a Y-axis, the X-axis and the Y-axis being mutually orthogonal;
- a second plate parallel to and offset from the first plate along a Z-axis, the Z-axis being mutually orthogonal to the X-axis and the Y-axis;
- a first subsystem slidably coupled to the first plate, the first subsystem comprising a pick-and-place (PNP) carriage to slide along the Y-axis, the PNP carriage comprising a PNP head to slide along the X-axis, the PNP head comprising a PNP nozzle head to slide along the Z-axis; and
- a second subsystem slidably coupled to the second plate, the second subsystem comprising a thermo-mechanical (TM) carriage to slide along the X-axis and a TM head slidably coupled to the carriage to slide along the Z-axis, wherein:
- the PNP nozzle head includes a PNP nozzle to pick a semiconductor device from a first location and place the semiconductor device at a second location on a printed circuit board, and
- the TM head is to facilitate exertion of a predetermined pressure on the semiconductor device at the second location.

2. The system of claim 1, further comprising:
- separate sets of rails affixed to the first plate to facilitate sliding of the first subsystem along the X-axis and the Y-axis; and
- another set of rails affixed to the second plate to facilitate sliding of the second subsystem along the X-axis.

3. The system of claim 1, wherein:
- the first subsystem is to slide between a home position and a plurality of active positions, and
- the plurality of active positions of the first subsystem comprises at least:
  - a first active position proximate to the first location;
  - a second active position proximate to the second location; and
  - a third active position proximate to a third location.

4. The system of claim 3, wherein:
- the PNP head further comprises a vision head at a fixed offset from the PNP nozzle head, and
- the vision head is to identify the plurality of active positions of the first subsystem.

5. The system of claim 1, wherein the second subsystem is to slide between a home position and an active position.

6. The system of claim 5, wherein the active position of the second subsystem is proximate to the second location.

7. The system of claim 1, wherein the TM carriage comprises:
- a TM carriage first plate including a plurality of sliders to facilitate sliding on rails, the rails being attached to the second plate of the system; and
- a TM carriage second plate parallel to and coupled at a fixed offset from the TM carriage first plate along the Z-axis.

8. The system of claim 7, wherein the TM head comprises:
- a TM head first plate between the TM carriage first plate and the TM carriage second plate;
- a TM head second plate parallel to and coupled at a fixed offset from the TM first plate, the TM head second plate positioned between the TM carriage second plate and the first plate of the system, the TM head second plate having a first side proximate to the TM head first plate and an opposing second side proximate to the first plate of the system; and a casing coupled by spring-loaded fasteners to the second side of the TM head second plate, wherein:

the TM head first plate is to slide along the Z-axis, the casing is to envelope the semiconductor device on the printed circuit board, and the spring-loaded fasteners are to enable the casing to maintain contact on the printed circuit board.

9. The system of claim 8, wherein the second subsystem further includes a fixture removably coupled to the TM head second plate by spring-loaded fasteners, wherein the fixture is to exert the predetermined pressure on the semiconductor device.

10. The system of claim 1, wherein:

the TM head is further to facilitate heat transfer to the semiconductor device at the second location, the second subsystem further comprises a fixture to facilitate the heat transfer, the fixture is to further exert the predetermined pressure on the semiconductor device, and the fixture is mounted to the TM head by spring-loaded fasteners.

11. An apparatus, comprising:

a frame having a bottom plate and a top plate in a three-dimensional space of mutually orthogonal X-axis, Y-axis and Z-axis, the top plate offset from the bottom plate along the Z-axis;

a thermo-mechanical (TM) subsystem slidably coupled to the top plate, the TM subsystem comprising:

a TM carriage to slide along the X-axis; and a TM head to slide on the carriage along the Z-axis, the TM head configured to position a fixture to exert pressure on a semiconductor device in a socket of a printed circuit board; and a pick-and-place (PNP) subsystem slidably coupled to the bottom plate, the PNP subsystem comprising:

a PNP carriage to slide along the Y-axis;

a PNP head to slide on the PNP carriage along the X-axis; and a PNP nozzle head to slide on the PNP head along the Z-axis, the PNP nozzle head comprising:

a PNP nozzle to rotate around the Z-axis and to removably couple to the semiconductor device; and a vision head to recognize the semiconductor device from surroundings of the semiconductor device.

12. The apparatus of claim 11, wherein:

the apparatus is electrically coupled to a control system to control movements of the PNP carriage, the PNP head, the PNP nozzle head, the TM carriage, and the TM head, and the control system comprises:

a plurality of actuators to control movements of the PNP carriage, the PNP head, the PNP nozzle head, the TM carriage, and the TM head separately, a plurality of remote terminal units (RTUs) controlling corresponding ones in the plurality of actuators; and a controller communicable with the plurality of RTUs on a MODBUS interface.

13. The apparatus of claim 12, wherein the plurality of RTUs is electrically coupled to the controlled in a daisy chain.

14. The apparatus of claim 12, wherein the plurality of actuators comprises:

a first actuator to control sliding of the PNP carriage along the Y-axis;

a second actuator to control sliding of the PNP head on the PNP carriage along the X-axis;

a third actuator to control sliding of the TM carriage on the top plate along the X-axis;

a fourth actuator to control sliding of the TM head on the TM carriage along the Z-axis;

a fifth actuator to control sliding of the PNP nozzle head on the PNP head along the Z-axis; and a sixth actuator to control rotation of the PNP nozzle head around the Z-axis.

15. The apparatus of claim 12, wherein:

the plurality of actuators comprises a first subset, a second subset, and a third subset, each actuator in the first subset comprises a servo motor coupled to a lead screw, the lead screw coupled to a nut that converts rotation of the lead screw to translation along the lead screw, each actuator in the second subset comprises a stepper motor coupled to a lead screw, the lead screw coupled to a nut that converts rotation of the lead screw to translation along the lead screw, and each actuator in the third subset comprises a hollow-shaft theta motor.

16. A system, comprising:

a handler configured to: (i) pick up a semiconductor device from a tray, (ii) place the semiconductor device in a socket of a printed circuit board, (iii) exert a predetermined pressure on the semiconductor device in the socket, and (iv) return the semiconductor device to the tray;

a tester configured to test the semiconductor device in the socket; and a control system configured to: (i) automate operations of the handler, and (ii) coordinate between the handler and the tester, wherein:

the handler comprises a pick-and-place (PNP) subsystem and a thermo-mechanical (TM) subsystem, the PNP subsystem and the TM subsystem are to move independent of each other on separate rails, the PNP subsystem is to (i) pick up a semiconductor device from the tray, (ii) place the semiconductor device in the socket, and (iii) return the semiconductor device to the tray, and the TM subsystem is to exert the predetermined pressure on the semiconductor device in the socket.

17. The system of claim 16, wherein:

the PNP subsystem is to move between a PNP home position, a first active position, a second active position and a third active position, the TM subsystem is to move between a TM home position and the third active position, and the PNP home position is different from the TM home position.

18. The system of claim 16, wherein movements of the PNP subsystem and the TM subsystem are controlled by the control system without human intervention.

19. The system of claim 16, wherein the control system controls movements of the PNP subsystem based on information from the tester.

20. The system of claim 16, wherein:

the PNP subsystem comprises a vision head to recognize the semiconductor device in the tray, the vision head is further to identify a center and orientation of the semiconductor device, and based on the identifying, the control system enables the PNP subsystem to pick up the semiconductor device from the tray.

* * * * *